United States Patent
Jo et al.

(10) Patent No.: US 10,608,180 B2
(45) Date of Patent: Mar. 31, 2020

(54) RESISTIVE MEMORY CELL WITH INTRINSIC CURRENT CONTROL

(71) Applicant: Crossbar, Inc., Santa Clara, CA (US)

(72) Inventors: Sung Hyun Jo, Sunnyvale, CA (US); Xianliang Liu, Emeryville, CA (US); Xu Zhao, Richmond, CA (US); Zeying Ren, Albany, CA (US); FNU Atiquzzaman, Berkeley, CA (US); Joanna Bettinger, Oakland, CA (US); Fengchiao Joyce Lin, San Jose, CA (US)

(73) Assignee: CROSSBAR, INC., Santa Clara, CA (US)

(*) Notice: Subject to any disclaimer, the term of this patent is extended or adjusted under 35 U.S.C. 154(b) by 0 days.

(21) Appl. No.: 15/676,231

(22) Filed: Aug. 14, 2017

(65) Prior Publication Data

US 2018/0062075 A1    Mar. 1, 2018

Related U.S. Application Data

(63) Continuation of application No. 15/012,530, filed on Feb. 1, 2016, now Pat. No. 9,735,357.

(Continued)

(51) Int. Cl.
*H01L 27/24* (2006.01)
*H01L 45/00* (2006.01)

(52) U.S. Cl.
CPC .......... *H01L 45/146* (2013.01); *H01L 45/085* (2013.01); *H01L 45/12* (2013.01);
(Continued)

(58) Field of Classification Search
CPC .............. H01L 27/2463; H01L 45/1233; H01L 45/1246; H01L 45/1253; H01L 45/146
(Continued)

(56) References Cited

U.S. PATENT DOCUMENTS 5,627,451 A    5/1997   Takeda
6,861,356 B2   3/2005   Matsuse
(Continued)

FOREIGN PATENT DOCUMENTS

CN   103280526   9/2013
CN   103682091   3/2014
(Continued)

OTHER PUBLICATIONS

Office Action for U.S Appl. No. 15/159,135 dated Aug. 24, 2017, 22 pages.
(Continued)

*Primary Examiner* — Didarul A Mazumder
(74) *Attorney, Agent, or Firm* — Wegman Hessler

(57) ABSTRACT

Providing for a two-terminal memory cell having intrinsic current limiting characteristic is described herein. By way of example, the two-terminal memory cell can comprise a particle donor layer having a moderate resistivity, comprised of unstable or partially unstable metal compounds. The metal compounds can be selected to release metal atoms in response to an external stimulus (e.g., an electric field, a voltage, a current, heat, etc.) into an electrically-resistive switching medium, which is at least in part permeable to drift or diffusion of the metal atoms. The metal atoms form a thin filament through the switching medium, switching the memory cell to a conductive state. The moderate resistivity of the particle donor layer in conjunction with the thin filament can result in an intrinsic resistance to current through the memory cell at voltages above a restriction voltage, protecting the memory cell from excessive current.

20 Claims, 14 Drawing Sheets

Related U.S. Application Data

(60) Provisional application No. 62/111,383, filed on Feb. 3, 2015.

(52) U.S. Cl.
CPC ........ *H01L 45/1233* (2013.01); *H01L 45/145* (2013.01); *H01L 27/2409* (2013.01); *H01L 27/2481* (2013.01)

(58) Field of Classification Search
USPC .......................................................... 257/4, 5
See application file for complete search history.

(56) References Cited

U.S. PATENT DOCUMENTS

| | | | |
|---|---|---|---|
| 7,667,442 B2 | 2/2010 | Itoh | |
| 7,704,788 B2 | 4/2010 | Youn et al. | |
| 7,830,698 B2 | 11/2010 | Chen et al. | |
| 8,853,099 B2 | 10/2014 | Wang et al. | |
| 8,853,661 B1 | 10/2014 | Tendulkar et al. | |
| 8,872,246 B1 | 10/2014 | Stevens et al. | |
| 8,884,261 B2 | 11/2014 | Jo et al. | |
| 9,275,728 B2 | 3/2016 | Srinivasan et al. | |
| 9,735,357 B2 | 8/2017 | Jo et al. | |
| 2008/0019163 A1 | 1/2008 | Hoenigschmid et al. | |
| 2008/0128772 A1 | 6/2008 | Senzaki | |
| 2008/0247215 A1 | 10/2008 | Ufert | |
| 2008/0278988 A1 | 11/2008 | Ufert | |
| 2008/0301497 A1 | 12/2008 | Chung et al. | |
| 2010/0237314 A1 | 9/2010 | Tsukamoto et al. | |
| 2011/0121359 A1 | 5/2011 | Yang et al. | |
| 2011/0204314 A1 | 8/2011 | Baek et al. | |
| 2011/0310656 A1 | 12/2011 | Kreupl et al. | |
| 2012/0008366 A1* | 1/2012 | Lu ...................... G11C 13/0002 365/148 |
| 2012/0043519 A1 | 2/2012 | Jo et al. | |
| 2012/0074376 A1 | 3/2012 | Kumar et al. | |
| 2012/0252184 A1 | 10/2012 | Ninomiya | |
| 2013/0026438 A1* | 1/2013 | Wang ................. H01L 45/1233 257/4 |
| 2014/0014966 A1 | 1/2014 | Tabatabaie et al. | |
| 2014/0097397 A1 | 4/2014 | Park et al. | |
| 2014/0158973 A1 | 6/2014 | Yang et al. | |
| 2014/0166956 A1 | 6/2014 | Higuchi et al. | |
| 2014/0175357 A1 | 6/2014 | Nardi et al. | |
| 2014/0185358 A1 | 7/2014 | Jo et al. | |
| 2014/0192589 A1 | 7/2014 | Maxwell et al. | |
| 2014/0264236 A1* | 9/2014 | Kim ....................... H01L 45/06 257/4 |
| 2014/0269002 A1 | 9/2014 | Jo | |
| 2014/0335675 A1* | 11/2014 | Narayanan .......... H01L 45/1608 438/382 |
| 2014/0361235 A1 | 12/2014 | Wang et al. | |
| 2015/0021538 A1 | 1/2015 | Jo et al. | |
| 2016/0225824 A1 | 8/2016 | Jo et al. | |

FOREIGN PATENT DOCUMENTS

| | | |
|---|---|---|
| CN | 103999218 | 8/2014 |
| RU | 2011113573 | 10/2012 |

OTHER PUBLICATIONS

Taiwanese Office Action for Taiwanese Patent Application No. 105103270 dated Jan. 18, 2017, 14 pages (including translation).
International Search Report and Written Opinion for International Application No. PCT/US2016/016391 dated Jun. 3, 2016, 10 pages.
Office Action for U.S. Appl. No. 15/012,530 dated Jan. 12, 2017, 63 pages.
Office Action for U.S. Appl. No. 15/012,530 dated Aug. 11, 2016, 54 pages.
Office Action for U.S Appl. No. 15/159,135 dated Jan. 11, 2018, 17 pages.
Interview Summary received for U.S. Appl. No. 15/159,135 dated Mar. 19, 2018, 6 pages.
Non-Final Office Action received for U.S. Appl. No. 15/159,135 dated Apr. 27, 2018, 17 pages.
Final Office Action dated May 6, 2019 for U.S. Appl. No. 15/159,135.
Notice of Panel Decision dated Sep. 13, 2019 for U.S. Appl. No. 15/159,135 (2 pages long).
First Office Action for Chinese Patent Application No. 201611042581.X dated Apr. 2, 2019, 8 pages long.
Office Action dated Nov. 1, 2018 for U.S. Appl. No. 15/159,135, 53 pages.

\* cited by examiner

RESISTIVE MEMORY CELL WITH INTRINSIC CURRENT CONTROL

CROSS-REFERENCE TO RELATED APPLICATIONS

The present application for patent claims priority to and is a continuation of U.S. patent application Ser. No. 15/012,530 filed Feb. 1, 2016 and titled RESISTIVE MEMORY CELL WITH INTRINSIC CURRENT CONTROL, which claims the benefit of U.S. Provisional Application Ser. No. 62/111,383 filed Feb. 3, 2015 and titled RESISTIVE MEMORY CELL WITH INTRINSIC CURRENT CONTROL, each of which are hereby incorporated by reference herein in their entireties and for all purposes.

INCORPORATION BY REFERENCE

The present specification incorporates, by reference and for all purposes, application Ser. No. 11/875,541 filed Oct. 19, 2007 and application Ser. No. 12/575,921 filed Oct. 8, 2009.

TECHNICAL FIELD

This disclosure generally relates to resistive switching memory that has built-in current control, which enhances device reliability and reduces complexity of control circuits.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the present disclosure provide for a two-terminal memory cell having intrinsic current limiting characteristics. In some disclosed embodiments, the two-terminal memory cell can comprise a particle donor layer having a moderate resistivity, comprised of unstable or partially unstable metal compounds. The metal compounds can be selected to release metal atoms in response to an external stimulus (e.g., an electric field, a voltage, a current, heat, etc.). Moreover, the metal atoms can be ionized in response to the external stimulus, and as metal ions be highly conductive. The memory cell can also include an electrically-resistive switching medium that is at least in part permeable to drift or diffusion of the metal atoms. In response to the external stimulus, the metal atoms diffuse from the particle donor layer to the switching medium. Upon removal of the external stimulus, the metal atoms become trapped within defects (grain boundaries, vacancies, etc.) of the switching medium, and form a highly conductive thin filament or path through the switching medium. In addition to the foregoing, the moderate resistivity of the particle donor layer in conjunction with the thin filament can result in an increased resistance to current flow through the memory cell at voltages above a restriction voltage. The increased resistance to current can protect the memory cell from detrimental effects of excessive electrical current, even in the absence of external current compliance (e.g., current-compliance facilitated by circuitry external to the memory cell).

In further embodiments, a 1 transistor—n resistive cell (1T-nR, where n is a suitable positive integer) memory architecture is provided having high operational bandwidth. The 1T-nR memory architecture can comprise a row of n disclosed two-terminal memory cells connected to a single select transistor (e.g., complementary metal oxide semiconductor (CMOS) transistor) for activation/deactivation. The memory architecture can apply a program voltage across the row, without external current compliance, while mitigating or avoiding excess current at respective memory cells on the row. This facilitates a memory architecture having high performance of two-terminal memory, in conjunction with high memory density (e.g., by avoiding additional current compliance for each cell of a 1T-nR memory architecture), high operational bandwidth (e.g., as high as a full row(s) of cells), with enhanced longevity and resistance to catastrophic failure. Accordingly, the disclosed embodiments contribute significant advancements to existing memory technologies.

In an embodiment, there is disclosed a non-volatile memory cell. The non-volatile memory cell can comprise a bottom electrode, and an electrically-resistive switching layer above the bottom electrode that is at least in part permeable to movement of the current-carrying particles within the electrically-resistive switching layer. Further, the non-volatile memory cell can comprise a particle donor layer above the electrically-resistive switching layer that provides conducting particles to the electrically-resistive switching layer in response to a stimulus, wherein the particle donor layer has an electrical resistivity of about 0.5 milliohm (mohm)-centimeter (cm) or greater. Moreover, the non-volatile memory cell can comprise a top electrode, wherein: the top electrode, particle donor layer, electrically-resistive switching layer and bottom electrode are disposed electrically in serial.

In other embodiments, the subject disclosure provides a semiconductor device comprising a semiconductor substrate including a plurality of CMOS devices and a resistive memory device disposed upon the semiconductor substrate and connected to a CMOS device of the plurality of CMOS devices. Further, the resistive memory device can comprise a bottom electrode and a resistive switching material layer disposed upon the bottom electrode, wherein the resistive switching material layer comprises a plurality of defect locations, and wherein a resistivity for the resistive switching material layer is larger than about 0.5 ohm-cm. In addition to the foregoing, the resistive memory device can comprise a resistive layer disposed upon the resistive switching material layer, wherein the resistive layer comprises metal atoms and a metal compound, wherein a plurality of metal atoms from the resistive layer diffuse to defect locations from the plurality of defect locations in the resistive switching material, and wherein the resistive layer is characterized by a resistivity within a range of about 0.5 milliohm-cm to about 0.1 ohm-cm. The resistive switching device can further comprise a top electrode disposed upon the resistive layer.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
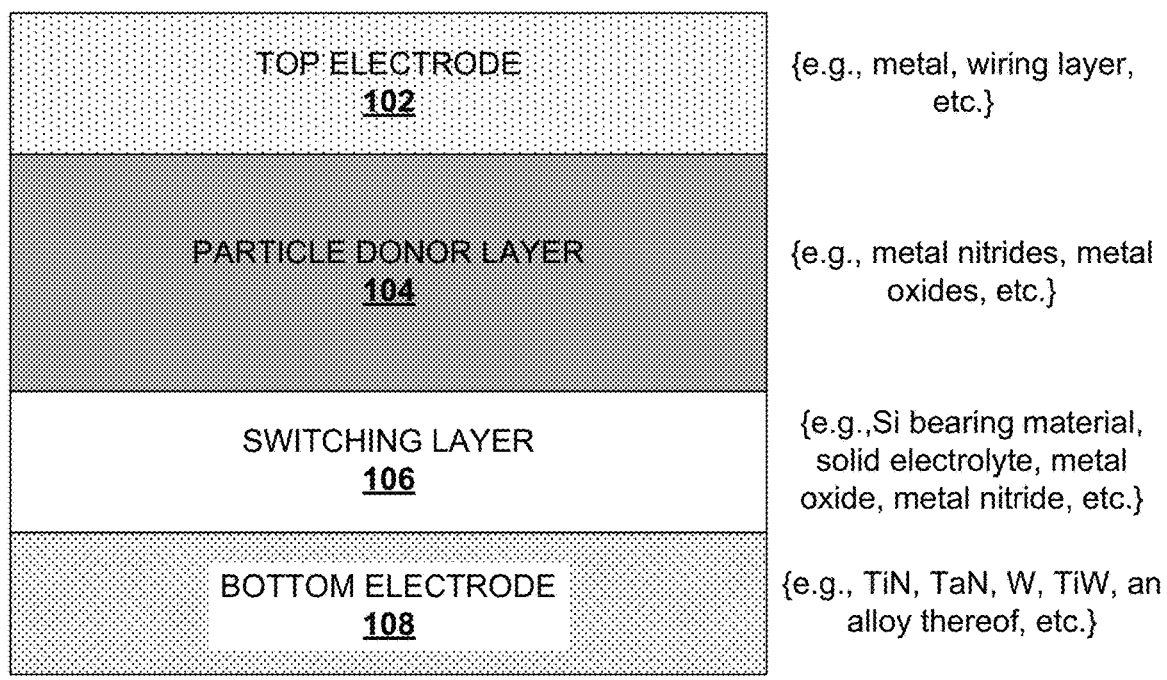
FIG. 1 depicts a block diagram of an example memory cell having intrinsic current limiting characteristics, according to one or more embodiments.

One area of continued research for improvement in non-volatile memory devices is higher memory density, which translates into greater storage capacity per device. One solution is to progress to smaller technology nodes, enabling a greater number of smaller devices to be provided on a given amount of chip space. In the last decade, memory devices have broken the 100 nanometer (nm) scale, and have continued to progress to 65 nm, 45 nm, 32 nm, and so on. However, for conventional memory, such as NAND or NOR memory technology, several performance and longevity issues have arisen at sub-100 nm technologies.

Two-terminal memory has emerged to provide alternatives to NAND and NOR memory, without many of the problems associated with conventional memory at sub-100 nm nodes. For instance, the inventors of the present disclosure are cognizant of resistive-switching memory technologies that have higher overall performance and longevity than conventional memories, even at 20 nm nodes and below. One mechanism the assignee of the present disclosure has proposed for improved memory density is referred to as a 1T-nR memory architecture, where n is a suitable positive number (e.g., 128, 256, 512, 1024, 2048, etc.). Although CMOS transistors on a substrate surface can have problems below, e.g., 40 nm, the inventors believe that two-terminal memories will be quite robust well below 20 nm. Accordingly, a memory architecture that has large numbers of two-terminal memory devices (nR) and few CMOS transistors (1T) can achieve very high memory densities in two-terminal memory architectures.

The inventors have identified one challenge with the 1T-nR memory architecture addressed by disclosed embodiments. At an operational level, high operational bandwidth is a desired aspect of a memory device. The operational bandwidth determines a number of memory cells that can be programmed or erased with a single operation. Higher bandwidth can result in faster overall program and erase times for such a device. However, a greater amount of current is consumed when programming large numbers of memory cells. To keep from over-heating a memory cell, the inventors have proposed memory circuits that utilize current compliance circuitry for each cell or a group of cells, to reduce probability of damaging individual cells. In a 1T-nR architecture with high n, however, the transistor is the single point of external current compliance. Therefore, through a single point, the large amount of current must be supplied to the n two-terminal memory cells. Without current compliance for individual cells, the inventors have recognized that a single cell or small group of cells can receive an excessive amount of current, risking damage to the cell(s). Accordingly, the inventors have provided various embodiments in which a resistive-switching memory cell comprises intrinsic current limiting characteristics, to resist excess current through the memory cell and mitigate or avoid memory cell damage even in conjunction with high bandwidth memory operations. Furthermore, disclosed memory cells having intrinsic current limiting features can be operated with less complex memory control circuitry, simplifying architecture design, and enabling memory cells to scale to lower process nodes, without changing the process.

Examples of two-terminal memory technology include resistive memory (e.g., resistive-switching memory cell), ferromagnetic memory, phase change memory, magneto-resistive memory, organic memory, conductive bridging memory, and so on. Embodiments of the subject disclosure can provide a filamentary-based memory cell. One example of a filamentary-based memory cell can comprise: a conductive layer (e.g. TiN, TaN, TiW) or a conductive silicon (Si) bearing layer (e.g., doped polysilicon, polycrystalline SiGe, etc.) a resistive switching layer (RSL) having crystalline defects or defect regions (e.g. amorphous silicon, intrinsic silicon, non-stoichiometric oxide, non-stoichiometric silicon oxide); and an active metal layer for providing filament forming particles to the defect regions of RSL. In various examples, the active metal layer can include, among others: silver (Ag), copper (Cu), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd), alloys of such metals, as well as materials rich in such metals, such as non-stoichiometric metal compounds. Other suitable conductive materials, as well as compounds or combinations of the foregoing can be employed for the active metal layer in some aspects of the subject disclosure. In various embodiments, particles of metal derived from the active metal layer become trapped within the defect regions (e.g. voids, grain boundaries, or the like) of the RSM. These trapped particles are neutral metal particles that form conductive filaments within the RSM. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In some aspects, the two-terminal memory can comprise 20 nanometer (nm) technology, whereas in other aspects the two-terminal memory can comprise sub-20 nanometer technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on. In the case of multi-level cells (MLC), two stacked layers of cells that can represent two bits of data per cell can have an effective component area of 1.07 $F^2$, and better component area metrics can be achieved by either increasing the number of stacks or the number of bits represented by the cells.

DESCRIPTION OF EXAMPLE EMBODIMENTS

Referring now to the drawings, FIG. 1 illustrates a block diagram of an example two-terminal memory cell 100 having intrinsic current limiting characteristics, according to one or more disclosed embodiments. In various embodiments, two-terminal memory cell 100 can be formed on a semiconductor substrate as part of an array of two-terminal memory. In some embodiments, memory cell 100 can be formed with front-end-of-line fabrication techniques. In other embodiments, memory cell 100 can be formed with backend-of-line fabrication techniques.

Memory cell 100 comprises a bottom electrode 108. Bottom electrode 108 is a conductive material, and can include TiN, TaN, W, WN, TiW or a suitable alloy of the foregoing, in some embodiments. In other embodiments, bottom electrode 108 can be a conductive silicon material, such as a polysilicon, a doped polysilicon, a polycrystalline SiGe, a doped polycrystalline SiGe, and so forth. Over bottom electrode 108 is a switching layer 106. Switching layer 106 can comprise an electrically-resistive material, which is at least in part porous to conductive particles (e.g., metal ions, oxygen vacancies, etc.). In various embodiments, switching layer 106 can further comprise defect sites in which conductive particles can become trapped in the absence of a suitably strong external stimulus. Accordingly, conductive particles can migrate within switching layer 106 until encountering a defect site. Particles are less likely to move out of defect sites absent a suitable stimulus to force them out. Therefore, particles diffusing or drifting within switching layer 106 will accumulate within defect sites. In various embodiments, switching layer 106 can be comprised of a Si-bearing material, a solid electrolyte, a metal oxide, a metal nitride, or the like. In an embodiment, switching layer 106 can have a material resistivity of greater than about 0.5 ohm-cm. In another embodiment, a thickness of switching layer 106 can be selected from a range of about 2 nm to about 100 nm.

Memory cell 100 can further comprise a particle donor layer 104 over switching layer 106. Particle donor layer 104 can comprise a metal compound having an unstable or semi-stable state. Further, the metal compound can be selected to have a material resistivity between about 0.5 milliohm-cm (mohm-cm) and about 100 mohm-cm, in one or more embodiments. In an embodiment, particle donor layer can be selected from a range of about 5 nm to about 200 nm thick. In response to a suitable stimulus (e.g., an electric field, a current, a voltage, joule heating, and so on), some of the metal compounds can separate into free metal atoms and metal ions, and diffuse (or drift) into switching layer 106. The material resistivity of particle donor layer 104 can result in a relatively narrow width for this diffusion, resulting in a thin filament of metal ions drifting into switching layer 106 in response to the stimulus. In contrast, high purity metal donor layers tend to have much lower resistivity. For instance, silver, copper, aluminum, platinum, gold and other active metals suitable for donating particles to neighbor layers have resistivity values between about 0.0109 milliohm-cm (e.g., for platinum) to about 0.00159 milliohm-cm (e.g., for silver). Materials with these much lower resistivity values will result in significantly higher current in memory cell 100 in response to formation of a continuous conductive filament through switching layer 106. This higher current will facilitate formation of a wider, thicker conductive filament, facilitating the higher current flow throughout memory cell 100. Thus, the low resistivity of metal ion donor layers provide a positive feedback mechanism (in forming thicker filaments) for increasing current in memory cell 100. Particle donor layer 104, in contrast, can mitigate or avoid this positive feedback, to form thin conductive filaments that mitigate increase in current through memory cell 100—when conductive—in response to a rising voltage (e.g., a voltage rising above a program threshold voltage that causes memory cell 100 to switch to the conductive state; a voltage within a range selected from about 1 v to about 3.3 volts, or other suitable voltage or range of voltages). In absence of the stimulus, the particles can become non-ionic (e.g., metal atoms) and remain trapped within defect sites of switching layer 106, maintaining the filament of metal ions.

A second stimulus (e.g., having opposite polarity) can re-ionize the metal particles and cause them to drift back toward particle donor layer 104, discontinuing the filament (in the physical and electrical sense). Accordingly, in response to the stimulus a high-conductive path of metal particles can form across the switching layer, lowering an effective resistance of memory cell 100. In response to the second stimulus the metal particles can move back toward particle donor layer 104, breaking continuity of the filament, and restoring a high resistance state of memory cell 100. In at least one embodiment, the metal particles of particle donor layer 104 can be selected from a group consisting of: Ti, Ta, Al, Cu and Ag.

In some embodiments, memory cell 100 can comprise a top electrode 102 formed above particle donor layer 104. In at least one embodiment, top electrode 102 can be a metal wire of a memory array (e.g., a wordline, a bitline, a sourceline, etc., see FIG. 8, infra). In other embodiments, top electrode 102 can be a conductive plug that electrically connects particle donor layer 104 to the metal wire of the memory array. Top electrode 102 can be comprised of a suitable electrical conductor, such as a metal (e.g., Al, Cu, Ag, and so forth in conjunction with optional barrier material or adhesion material, including Ti, TiN, TaN, TiW, or the like, below or above the conductor layer), a conductive silicon (e.g., doped polysilicon, doped polycrystalline SiGe, etc.), or the like.

In various embodiments, particle donor layer 104 can be selected to have a second material resistivity in proportion to a first material resistivity of switching layer 106. In some embodiments, the proportion can be about 1:5; in other embodiments the proportion can be about 1:1000; whereas in still other embodiments the proportion can be selected from a range between about 1:5 and about 1:1000. In further embodiments, the proportion of second material resistivity of particle donor layer 104 to the first material resistivity of switching layer 106 can be larger than 1:1000 (e.g., 1:5000, 1:10,000, 1:100,000, etc.).

In further embodiments, particle donor layer 104 can comprise a metal nitride selected from the group consisting of: $TiN_x$, $TaN_x$, $AlN_x$, $CuN_x$, $WN_x$ and $AgN_x$, where x is a positive number. In other embodiments, particle donor layer 104 can comprise a metal oxide selected from the group consisting of: $TiO_x$, $TaO_x$, $AlO_x$, $CuO_x$, WO, and $AgO_x$. In other embodiments, particle donor layer 104 can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. In another embodiment, switching layer 106 can comprise a material selected from the group consisting of: $SiO_y$, $AlN_y$, $TiO_y$, $TaO_y$, $AlO_y$, $CuO_y$, $SiN_x$, $TiN_x$, $TiN_y$, $TaN_x$, $TaN_y$, $SiO_x$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x.

In an embodiment, particle donor layer 104 comprises a metal nitride: $MN_x$, and switching layer 106 comprises a metal nitride: $MN_y$, where y and x are positive numbers, and y is larger than x. In another embodiment, particle donor layer 104 comprises a metal oxide: $MO_x$, and switching layer 106 comprises a metal oxide: $MO_y$. In still other embodiments, the metal compound of particle donor layer 104 is selected from a first group consisting of: $MN_x$ and $MO_x$, and the switching layer is selected from a second group consisting of: $SiN_y$ and $SiO_y$, where y is a non-stoichiometric value.

Figure 2:
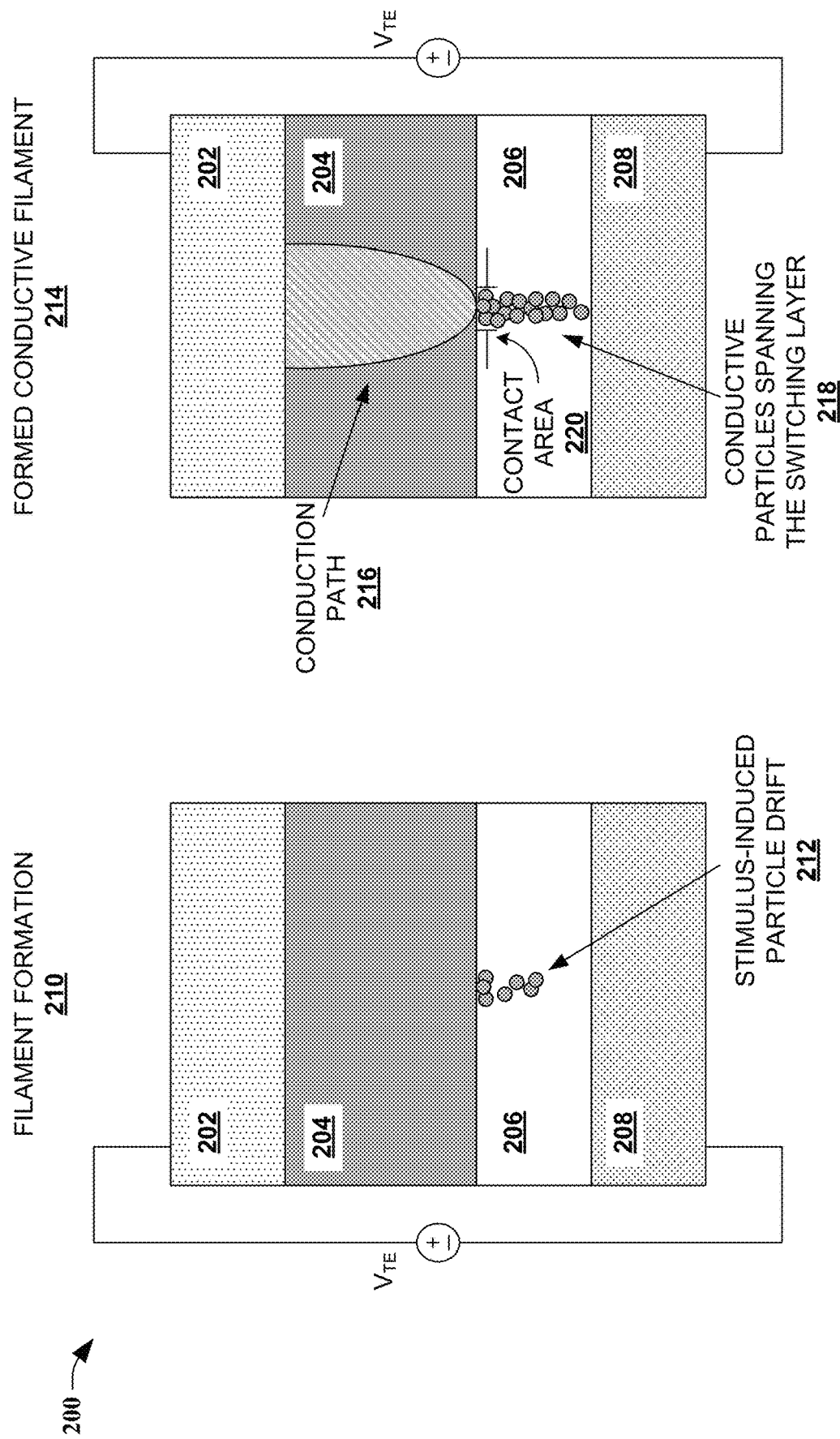
FIG. 2 illustrates block diagrams of example memory devices according to further embodiments.

FIG. 2 depicts block diagrams of example filament operation for a two-terminal memory cell 200, according to one or more additional embodiments. Memory cell 200 is depicted in two stages, including filament formation 210 stage and formed conductive filament 214 stage. Memory cell 200 comprises a top electrode 202, particle donor layer 204, switching layer 206 and bottom electrode 208 for each of the stages. At filament formation 210, a positive voltage is applied at top electrode 202, $V_{TE}$. Positive voltage at top electrode 202 generates an electric field, which ionizes metal atoms or metal particles (e.g., groups of metal atoms) in particle donor layer 204, and causes diffusion of the metal ions into switching layer 206. In various embodiments, particle donor layer 204 can be selected to have a moderate material resistivity (e.g., between about 0.5 mohm-cm and about 100 mohm-cm), causing metal ions to enter switching layer 206 in a relatively narrow band. This narrow band of metal ions is depicted is referred to in the FIG. 2 as stimulus-induced particle drift 212. Once metal ions extend through switching layer 206 (or far enough through switching layer 206 for a tunneling current to provide continuity between the filament and bottom electrode 208), a conductive filament having electrical continuity through switching layer 206 is formed. This is depicted at formed conductive filament 214 state, as conductive particles spanning the switching layer 218.

Once the conductive filament is formed, memory cell 200 has relatively high electrical conductivity in a conductive state. The resistivity of particle donor layer 204, in combination with a small contact area 220 of the conductive filament tend to result in a relatively narrow conduction path 216 through particle donor layer 204. In turn, the narrow conduction path and resistivity of particle donor layer 204 result in intrinsic current limiting characteristics. The current limiting characteristics can resist an increase in current through memory cell 200 after formation of the conductive filament (e.g., see FIG. 5, infra). Accordingly, once programmed to the conducting state, memory cell 200 can resist damage from high current, by limiting the increase in current through memory cell 200 for voltages above a threshold voltage (or a narrow threshold range of voltages).

Figure 2A:
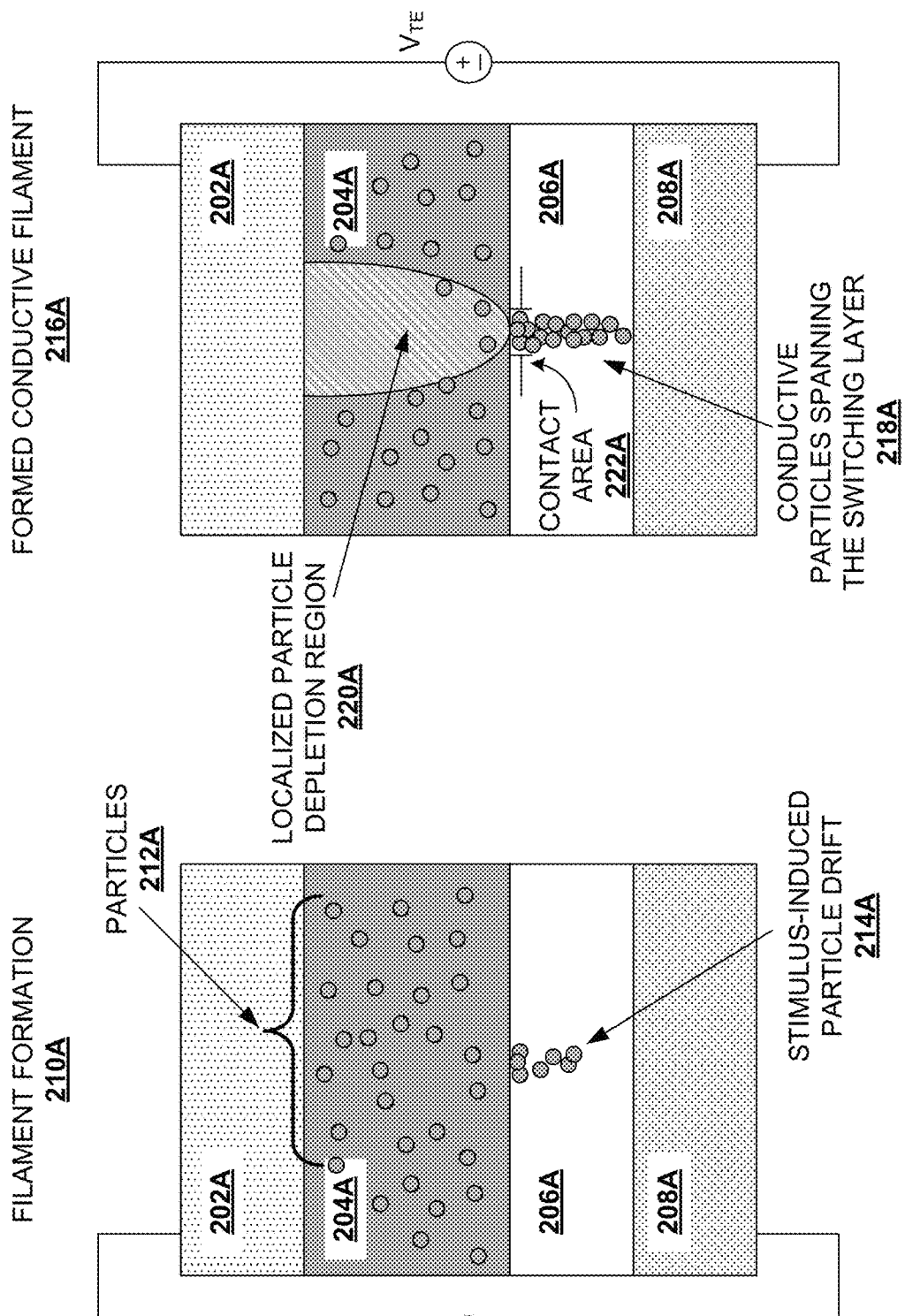
FIG. 2A depicts block diagrams of example memory devices facilitating controlled conductivity in a memory device according to other embodiments.

FIG. 2A depicts block diagrams of example filament operation for an alternative embodiment of the subject disclosure. In some embodiments, filament operation and memory cell of FIG. 2A can be in suitable part or in whole combined with filament operation/memory cell of FIG. 2. In other embodiments, the memory cells/filament operations can be distinct.

FIG. 2A depicts a memory cell 200A comprising a top electrode 202A overlying a particle donor layer 204A, which in turn overlies a switching layer 206A overlying a bottom electrode 208A. FIG. 2A illustrates the filament operation in two stages, including a filament formation 210A stage and a formed conductive filament 216A stage. Metal-containing particles 212A within particle donor layer 204A begin to drift within switching layer 206A in response to a bias (e.g., positive bias) applied to top electrode 202A. The stimulus-induced particle drift 214A does not provide a continuous electrical connection between particle donor layer 204A and bottom electrode 208A; accordingly an electrical resistance of switching layer 206A dominates conductivity of memory cell 200A during filament formation 210A. In one or more embodiments, particle donor layer 204A and particles 212A can be comprised of a metal nitride $MN_x$ (e.g., $AlN_x$ or other suitable metal nitride, where M is a metal) where x is a first positive number providing a non-stoichiometric relationship of Al and N. In at least one embodiment, switching layer 206A can additionally comprise a metal nitride $MN_y$ (e.g., $AlN_y$ or other suitable metal nitride, where y>x). The metal utilized for switching layer 206A can be the same metal used for particle donor layer 204A in some embodiments, whereas in other embodiments different metals can be employed.

During formed conductive filament 216A stage, the positive bias continues to drive particles 212A into switching layer 206A until conductive particles span the switching layer 206A, forming a conductive filament 218A. Particles 202A leaving particle donor layer 204A can leave a localized particle depletion region 220A, having higher electrical resistance than surrounding localities of particle donor layer 204A. The increased resistance in this localized particle depletion region 220A can mitigate an increase or spike in current through memory device 200A upon caused by completion of conductive filament 218A, and more particularly the completion (e.g., which can be abrupt) of electrical continuity of conductive filament 218A. By mitigating the increase in current, conductive filament 218A can complete continuity without driving large numbers of particles 212A into switching layer 206A, thereby maintaining a relatively thin conductive filament 218A and relatively small contact area 222A.

Figure 3:
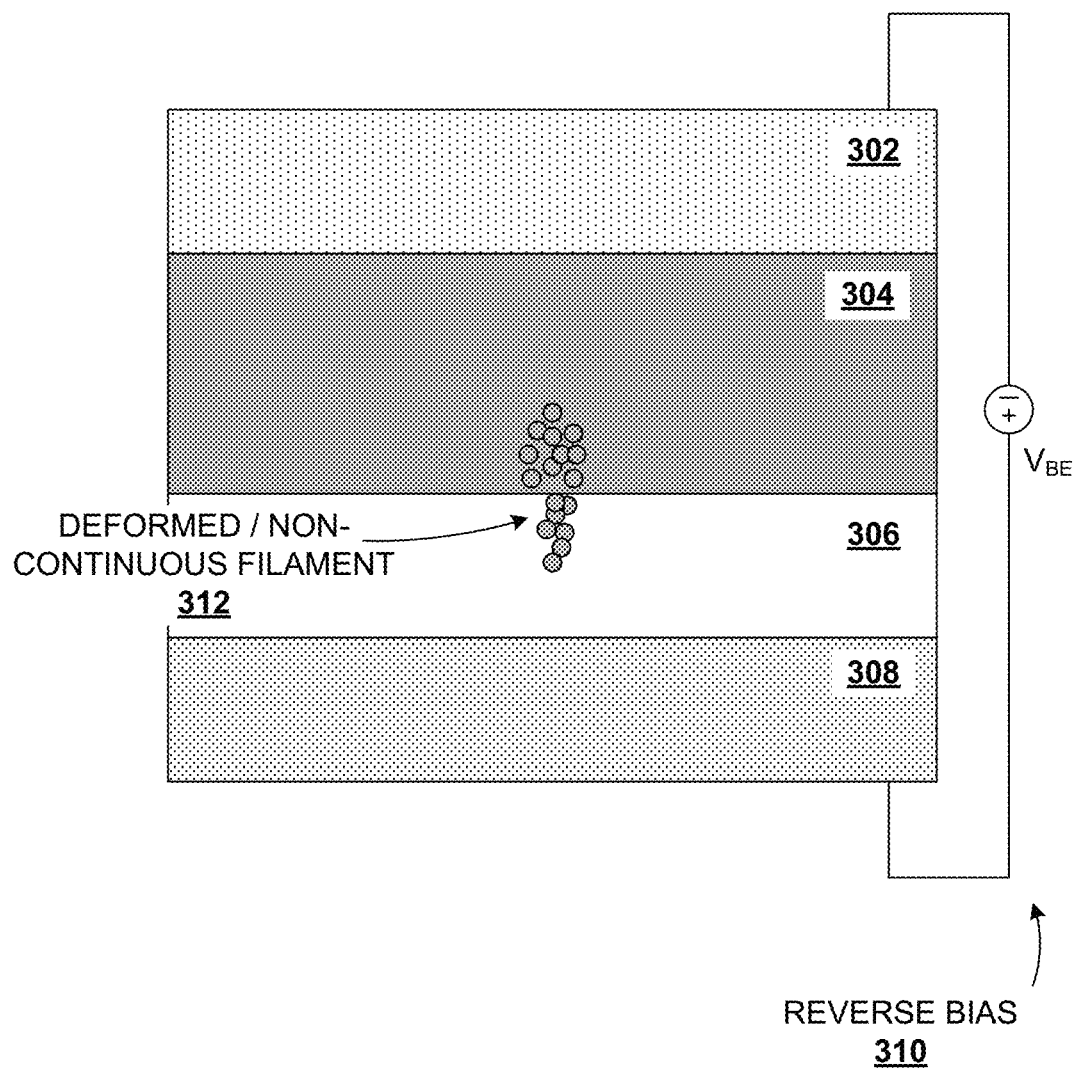
FIG. 3 depicts a block diagram of an example memory cell in response to a reverse bias, in an embodiment(s)

FIG. 3 depicts a block diagram of an example filament deformation 300 of a conductive filament within a disclosed two-terminal memory cell, according to one or more additional embodiments. The two-terminal memory cell comprises a top electrode 302, particle donor layer 304, switching layer 306 and bottom electrode 308 (e.g., similar to that described above at FIG. 2, supra). A reverse bias 310 is applied to the memory cell, of opposite polarity as a program bias used to form a conductive filament within the memory cell. In response to reverse bias 310, ions within switching layer 306 can be mobilized (e.g., removed from defect locations) and drift back toward particle donor layer 304. This breaks continuity of a conductive filament formed by the ions, restoring a high resistance state for the two-terminal memory device. As depicted, the ions that drift back toward particle donor layer 304 can re-enter the particle donor layer 304, or aggregate near a boundary of switching layer 306 and particle donor layer 304.

Figure 4:
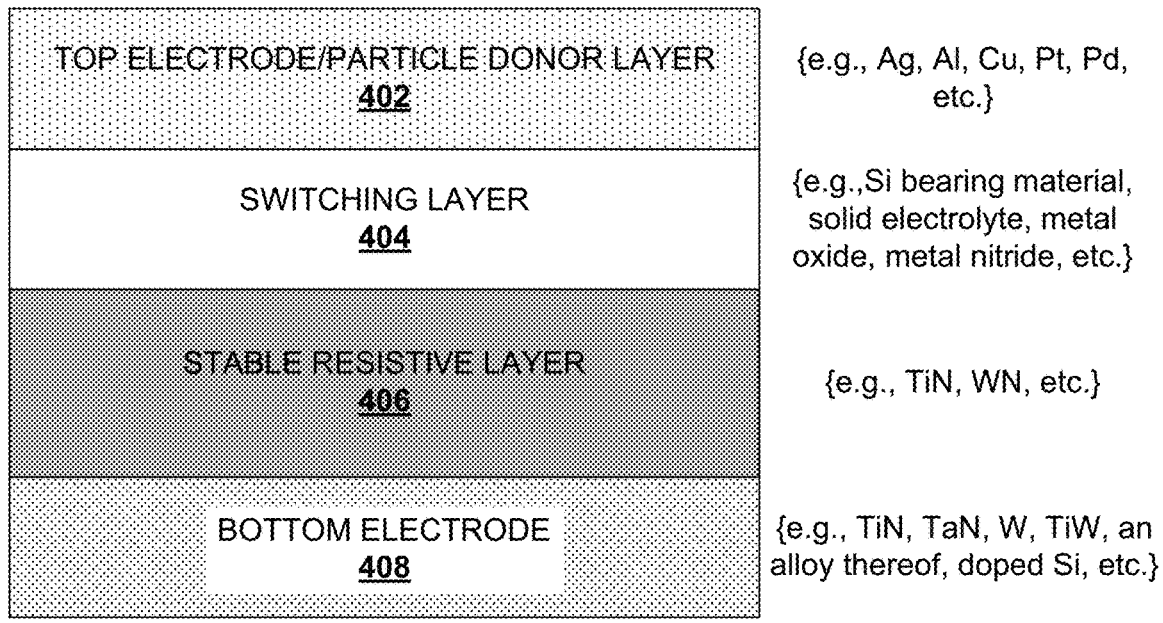
FIG. 4 depicts a block diagram of an alternative memory cell with intrinsic current limiting characteristics, in another embodiment.

FIG. 4 illustrates a block diagram of an alternative two-terminal memory cell 400, according to other disclosed embodiments. Memory cell 400 can comprise a top electrode 402, electrically-resistive switching layer 404, a stable resistive layer 406 and a bottom electrode 408. In the embodiment of memory cell 400, top electrode 402 can be a particle donor layer, and comprise metal atoms that can be ionized and drift into switching layer 404 in response to a suitable electric field applied to memory cell 400. According to this embodiment, top electrode can be comprised of a noble metal, Ag, Al, Cu, Pt, Pd, and others. Switching layer 404 can be a Si-bearing material, solid electrolyte, metal oxide, metal nitride, etc., having defect locations to trap metal particles within switching layer 404, in the absence of a suitable mobilizing stimulus. Additionally, stable resistive layer 406 can have a moderate material resistivity, e.g., between about 0.5 mohm-cm and about 100 mohm-cm. Stable resistive layer 406 can provide a minimum electrical resistance for memory cell 400, when a conductive filament is formed within switching layer 404 and the memory cell is in a conductive state. This electrical resistance can be selected to provide a reduced operating current for memory cell 400 in the conductive state. The stable resistive layer 406 can be composed of $SiN_x$, $TaN_y$ or $WN_z$ where x, y and z are positive numbers selected to produce compounds having resistivity between about 0.5 mohm-cm to about 100 mohm-cm.

Figure 5:
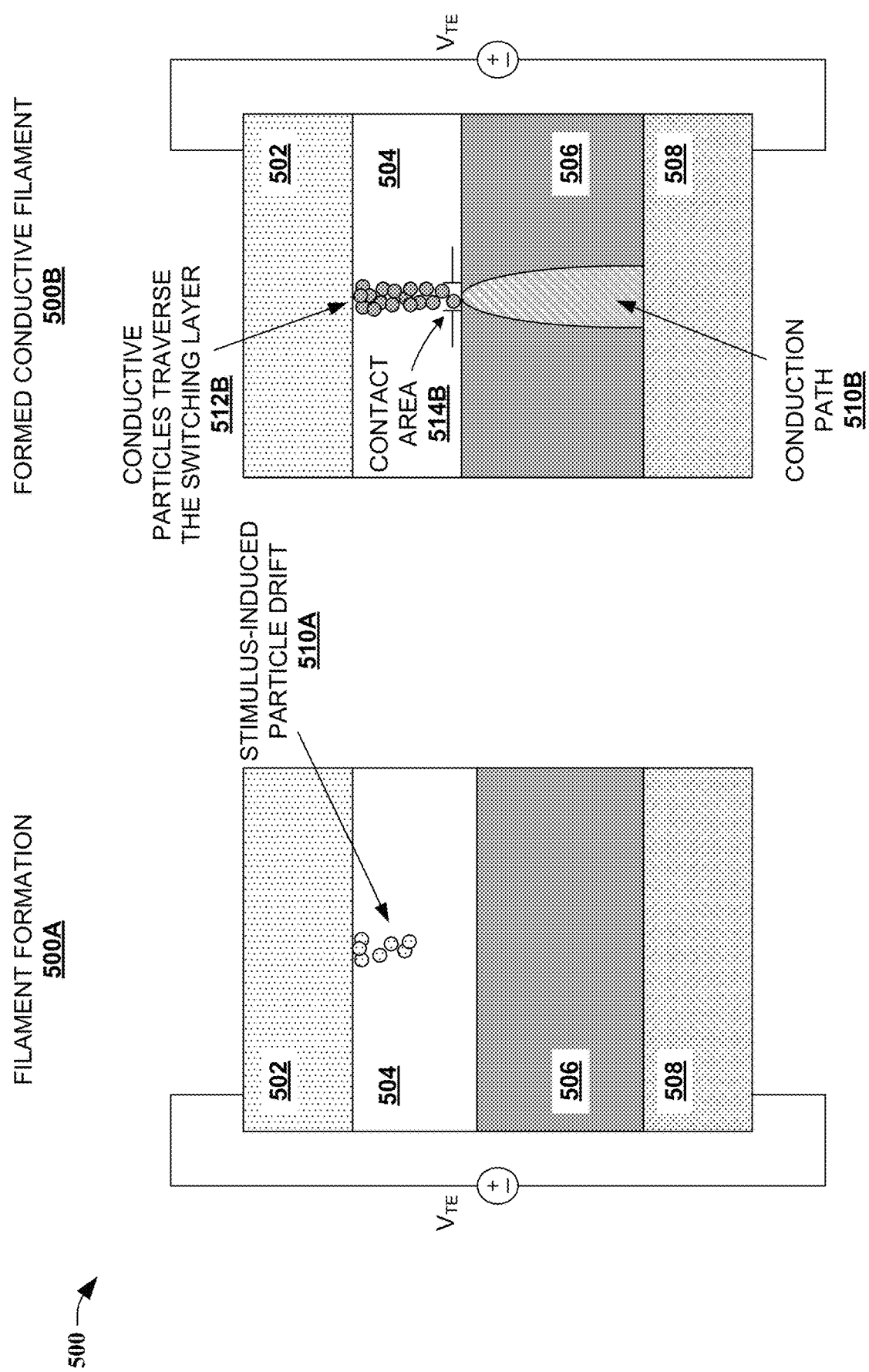
FIG. 5 illustrates a block diagram of example filament formation for the alternative memory cell, in one or more embodiments.

FIG. 5 illustrates block diagrams of an example filament formation for two-terminal memory cell 400 of FIG. 4, supra, referred to as memory cell 500 in the following description. Memory cell 500 is illustrated in two stages, including a filament formation 500A stage and a formed conductive filament 500B stage. Memory cell 500 comprises a top electrode 502 overlying an electrically-resistive switching layer 504, which overlies a stable resistive layer 506, which in turn overlies a bottom electrode 508. At filament formation 500A, a positive voltage $V_P$ is applied at top electrode 502. In some embodiments, $V_P$ can be the same or substantially the same as $V_{TE}$ applied to memory cell 200 of FIG. 2, supra. In other embodiments, $V_P$ can have a different magnitude from $V_{TE}$, depending on materials utilized for top electrode 502, electrically-resistive switching layer 504, stable resistive layer 506 or bottom electrode 508 (e.g., as compared with materials employed for memory cell 200), or depending on resistivity or resistance of electrically-resistive switching layer 504 or stable resistive layer 506 (e.g., as compared with resistivity or resistance of particle donor layer 204 and switching layer 206), or other factors associated with a program threshold voltage of memory cell 500.

The positive voltage $V_P$ applied at top electrode 502 generates an electric field, which ionizes metal atoms or metal particles in top electrode 502. Top electrode 502 can be a suitable particle donor layer comprising Ag, Al, Cu, Pt, Pd, and others (optionally in conjunction with a barrier material or an adhesion material, including Ti, TiN, TaN, TiW, or the like, below or above top electrode 502). Top electrode 502 can be comprised of a pure or substantially pure composition of the foregoing metals, as one example, having low resistivity (e.g., 0.02 mohm-cm or less) in some embodiments. Electrically-resistive switching layer 504 can have a high material resistivity that is, for instance, several orders of magnitude greater than the low resistivity of top electrode 502. During filament formation 500A, stimulus-induced particle drift 510A occurs within electrically-resistive switching layer 504, in which particles of top electrode 502 enter electrically-resistive switching layer 504 but do not (yet) provide electrical continuity between top electrode 502 and stable resistive layer 506. Therefore, during filament formation 500A, the electrical resistance of electrically-resistive switching layer 504 dominates the resistance of memory cell 500.

A formed conductive filament 500B is depicted on the right side of FIG. 5. Formed conductive filament 500B comprises conductive particles traversing the switching layer 512B, providing electrical continuity between top electrode 502 and stable resistive layer 506. Because formed conductive filament 500B provides a conductive path through the electrically-resistive switching layer 504, the electrical resistance of stable resistive layer 506 becomes the dominant resistance of memory cell 500.

Once formed conductive filament 500B provides electrical continuity between top electrode 502 and stable resistive layer 506, the current conducted by memory cell 500 increases significantly. In conventional memory devices, the increase in current following switching from a high resistance state to a low resistance state can drive a significant number of particles from a top electrode into a switching layer, resulting in a relatively thick conductive filament. Memory cell 500 can be configured to mitigate or avoid formation of a thick conductive filament, in various embodiments. For instance, a resistance or resistivity of stable resistive layer 506 can be selected to limit the increase in current conducted by memory cell 500 following formation of formed conductive filament 500B. By keeping the increase in current below a suitable threshold or within a suitable range, formed conductive filament 500B can remain quite thin, having a small contact area 514B with stable resistive layer 506. The small contact area 514B can also act to limit current flow through memory cell 500, by maintaining a small current cross-section and relatively narrow conduction path 510B at stable resistive layer. In various embodiments, stable resistive layer 506 can be selected to have a resistivity within a range of about 0.5 mohm-cm and about 100 mohm-cm. In further embodiments, stable resistive layer 506 can be composed of SiNx, TaNy, WNz, or the like, where x, y and z are positive numbers selected to form silicon nitride, tantalum nitride and tungsten nitride compounds, respectively, with resistivity within a range of about 0.5 mohm-cm and about 100 mohm-cm.

Figure 6:
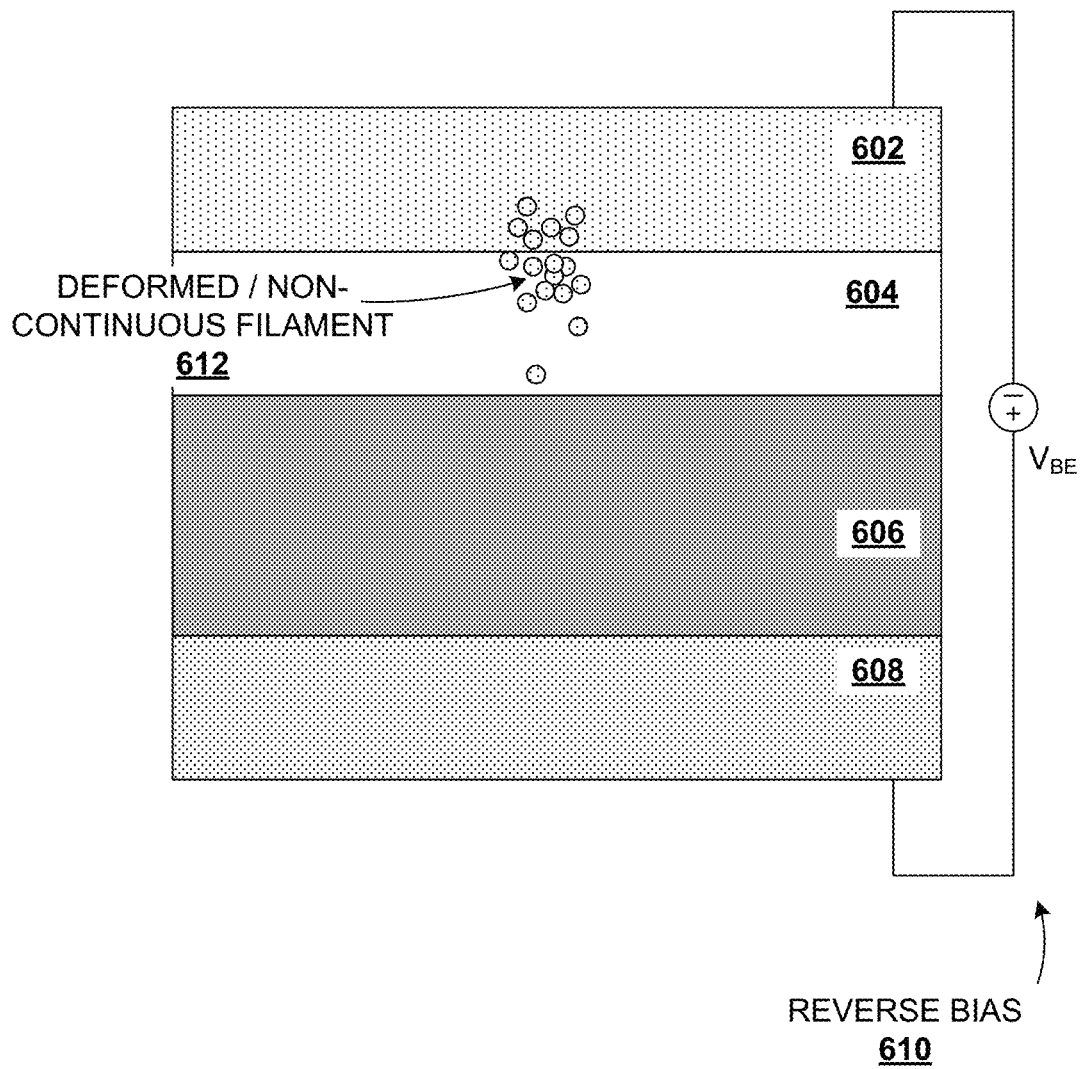
FIG. 6 depicts a block diagram of example filament deformation for the alternative memory cell in further embodiments.

FIG. 6 illustrates a block diagram of a sample filament deformation 600 of a conductive filament within a disclosed two-terminal memory cell, in various further embodiments. The two-terminal memory cell (e.g., a resistive-switching memory cell) comprises a top electrode 602, a switching layer 604, a stable resistive layer 606 and a bottom electrode 608. Top electrode 602 can be a particular donor layer, in various embodiments, comprising a metal having relatively high surface energy and diffusivity (e.g., Ag, Cu, Al, Pt, Au, etc.) so as to be at least in part permeable within switching layer 604. A reverse bias 610 applied to the memory cell causes ions within switching layer 604 are mobilized (e.g., removed from defect locations within switching layer 604 that would otherwise suitable—at low or no bias potential—to hold the ions in place) away from bottom electrode 608 and toward top electrode 602. Accordingly, ions or particles having created a conductive filament through switching layer 604 drift toward top electrode 602, and break electrical continuity. This results in a deformed/non-continuous filament 612 of particles within switching layer 604 or within top electrode 602 (or partially within both switching layer 604 and top electrode 602), that does not provide electrical continuity between top electrode 602 and stable resistive layer 606.

Figure 7:
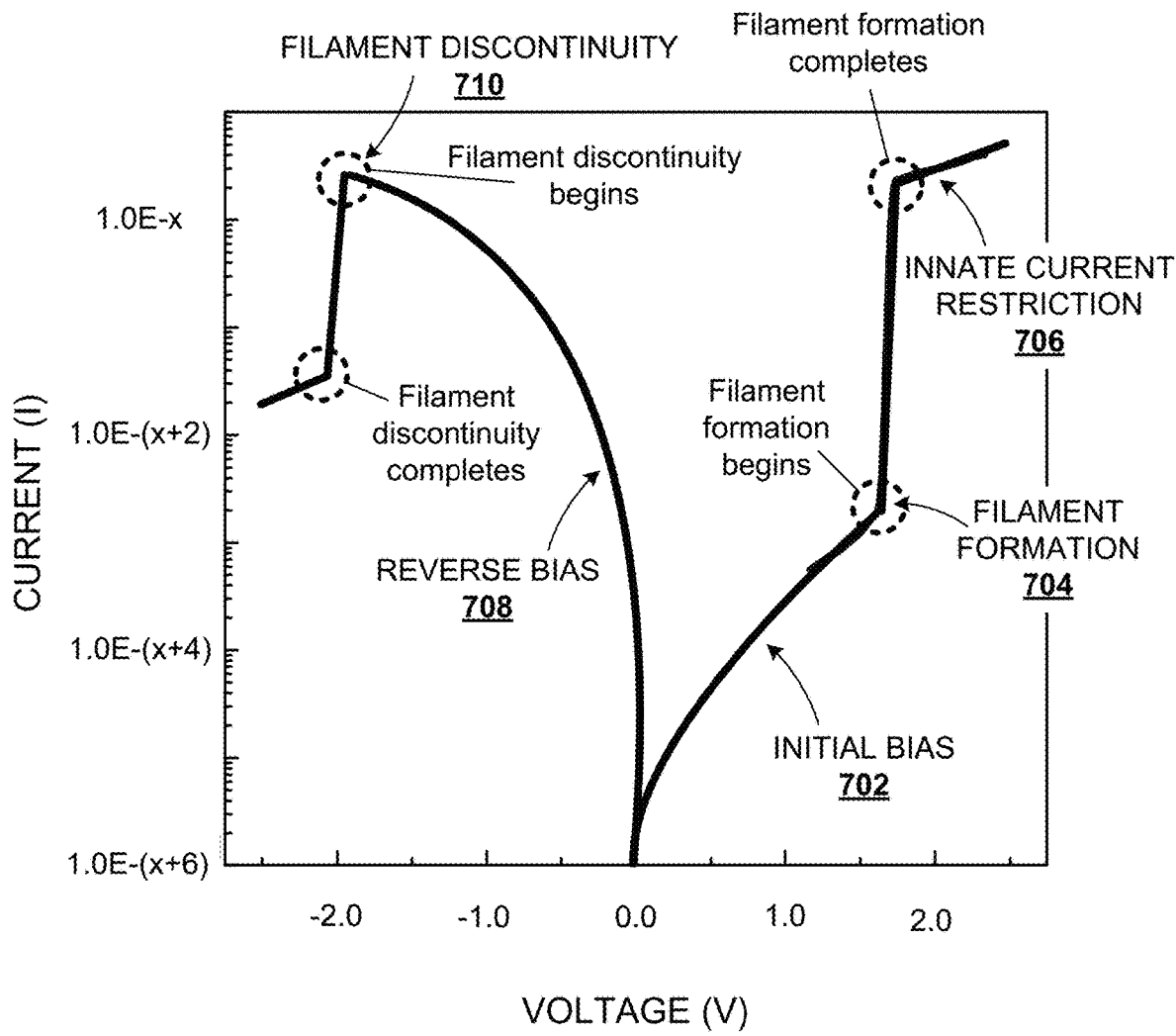
FIG. 7 illustrates a diagram of an example current-voltage response for a disclosed memory cell, in other embodiments.

FIG. 7 illustrates a diagram of an example current-voltage response 700 (I-V response 700) for a memory cell according to the embodiment of FIG. 1. It should be appreciated that I-V response 700 is merely an illustrative example, as current and voltage characteristics of memory cell 100 can vary for different selections of disclosed materials for various components of memory cell 100. In various embodiments, for instance, a program voltage for memory cell 100 can vary from between about 1 volt and about 3 volts, and can vary in different amounts or ranges for other embodiments.

As an overview, I-V response 700 illustrates current on a vertical axis and voltage on a horizontal axis. Current ranges from 1.0 E-11 amps to about 1.0 E-4 amps on a logarithmic scale. The horizontal voltage scale ranges from about +/−2.7 volts.

Initial bias 702 illustrates the I-V response of memory cell 100 in a resistive state. Current increases relatively slowly from 1.0 E-11 amps to about 1.0 E-8 amps over a range of zero volts to just over 1.5 volts, representing leakage current through the memory cell in its resistive state. At about 1.6 volts, filament formation 704 is initiated, where conductive particles drift into a switching layer of memory cell 100 and rapidly decrease electrical resistance of the memory cell. In various embodiments, filament formation 704—beginning at initiation of particle drift and completing with electrical continuity through the switching layer—can be very rapid, occurring in only a few nanoseconds in at least one embodiment. During filament formation 704, current increases rapidly from about 1.0 E-8 amps to about 2 E-5 amps over a couple tenths of a volt. This provides significant sensing margin for voltages above about 1.8 volts versus voltages below about 1.6 volts. Above about 1.8 volts, filament completion occurs and innate current restriction 706 is observed, where memory cell 100 has a much slower increase in current in response to increasing voltage. Current increases only about 20 to 30 microamps from about 1.8 volts to about 2.5 volts. Thus, at voltages greater than about 1.8 volts, memory cell 100 has a significant intrinsic restriction on current flow, protecting memory cell 100 from current spikes associated with large bandwidth memory operations (e.g., an operation having sufficient current to program hundreds of thousands of memory cells, as one example).

Memory cell 100 can be configured to be a reversibly programmable device. When in a conductive state, application of a reverse bias 708 ionizes metal particles of a conductive filament, and applies a force that pushes metal particles toward a particle donor layer. At filament discontinuity 710, electrical discontinuity of a conductive path formed by the conductive filament begins, causing the memory cell to be in a non-conductive state (e.g., see FIG. 3, supra). Filament discontinuity 710 can also be quite rapid, taking only a few nanoseconds or tens of nanoseconds, and resulting in multiple orders of magnitude reduction in current over about 100 millvolts.

Figure 8:
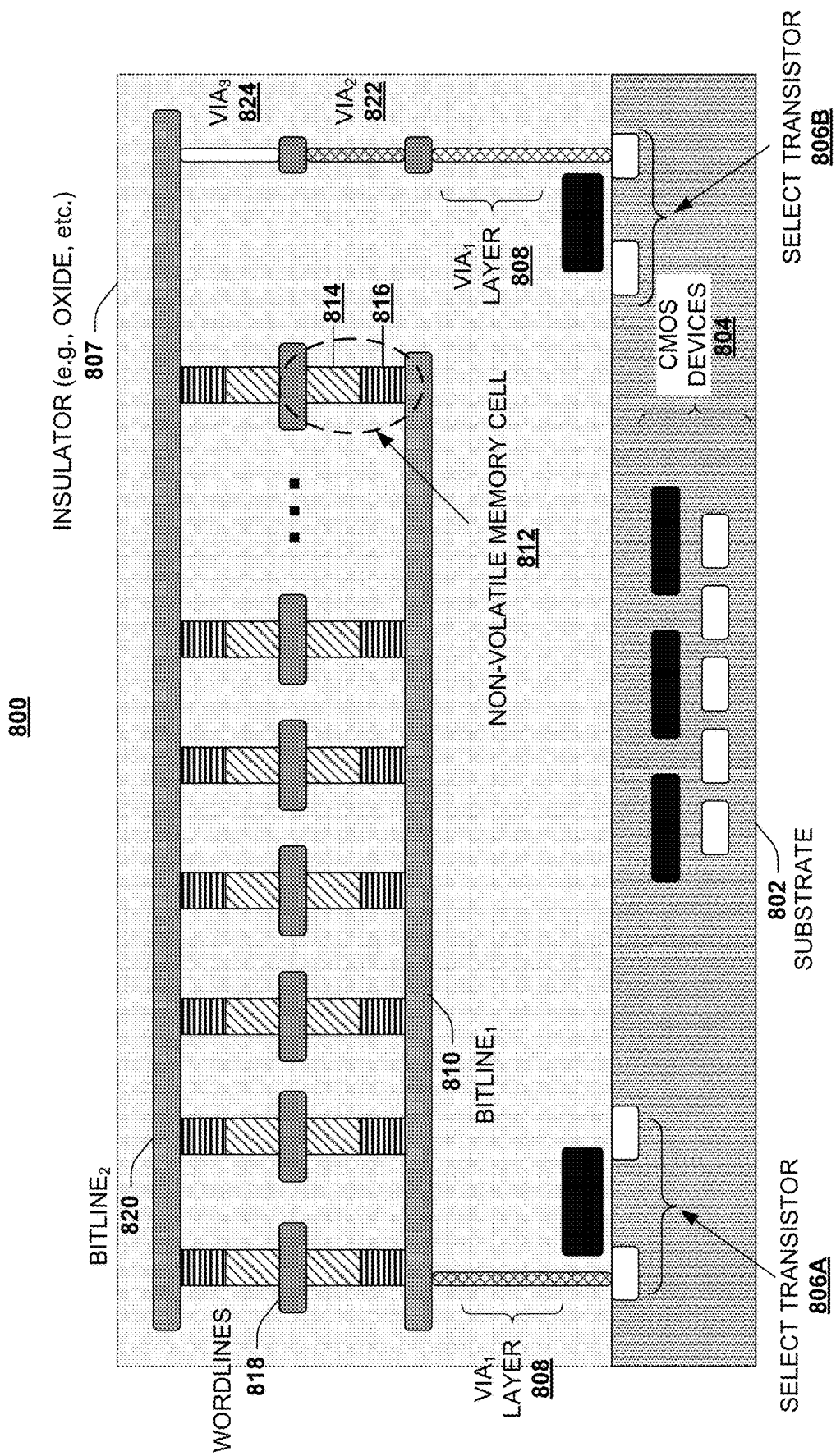
FIG. 8 depicts a diagram of a sample 1T-nR memory architecture having high operational bandwidth, in further embodiments.

FIG. 8 illustrates a block diagram of an example 1T-nR memory architecture 800 according to alternative or additional embodiments of the present disclosure. Memory architecture 800 comprises a substrate 802 comprising one or more CMOS devices 804 formed thereon or therein. Additionally, a set of select transistors 806 are formed on substrate 802. Select transistors 806 (including select transistors 806A, 806B) can be respectively connected to a number, n, of two-terminal memory cells, and activate or deactivate the two-terminal memory cells by connecting electrical power (e.g., a program signal, a read signal) or sensing circuits to the memory cells.

One or more insulator 807 layer(s) are formed over substrate 802 in conjunction with backend-of-line devices (e.g., metal lines, vias, vertical interconnects, memory arrays, and so on). A first via layer, $via_1$ 808 connects select transistor 806A to a first bitline, $bitline_1$ 810. A set of non-volatile memory cells 812 are formed on $bitline_1$ 810 and respectively connected to different wordlines of a set of wordlines 818. In some embodiments, non-volatile memory cells 812 can comprise a memory component 814 (e.g., memory cell 100, memory cell 400, etc.) in electrical series with a selector component 816. In one or more embodiments, selector component 816 can be a Crossbar FAST™ device, provided by the assignee of the present disclosure (e.g., see co-pending U.S. patent application Ser. No. 14/588,185 entitled SELECTOR DEVICE FOR TWO-TERMINAL MEMORY and filed Dec. 31, 2014, incorporated by reference herein in its entirety and for all purposes).

In some embodiments, a second set of non-volatile memory cells 812 can be formed above respective ones of wordlines 818 and connected to a second bitline, $bitline_2$ 820. $Bitline_2$ 820 can then be connected to a second select transistor, such as select transistor 806B. In the embodiments depicted by memory architecture 800, the connection can be accomplished by three via layers, including $via_1$ layer 808, a second via layer, $via_2$ layer 822 and a third via layer, $via_3$ layer 824.

Example Methods for Implementing Disclosed Embodiments

The diagrams included herein are described with respect to interaction between several layers of a memory cell, or memory cells in a memory architectures. It should be appreciated that such diagrams can include those layers specified therein, some of the specified layers, or additional layers (e.g., a barrier layer, a diffusion-mitigation layer, etc.). Sub-components of disclosed memory architectures can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 9:
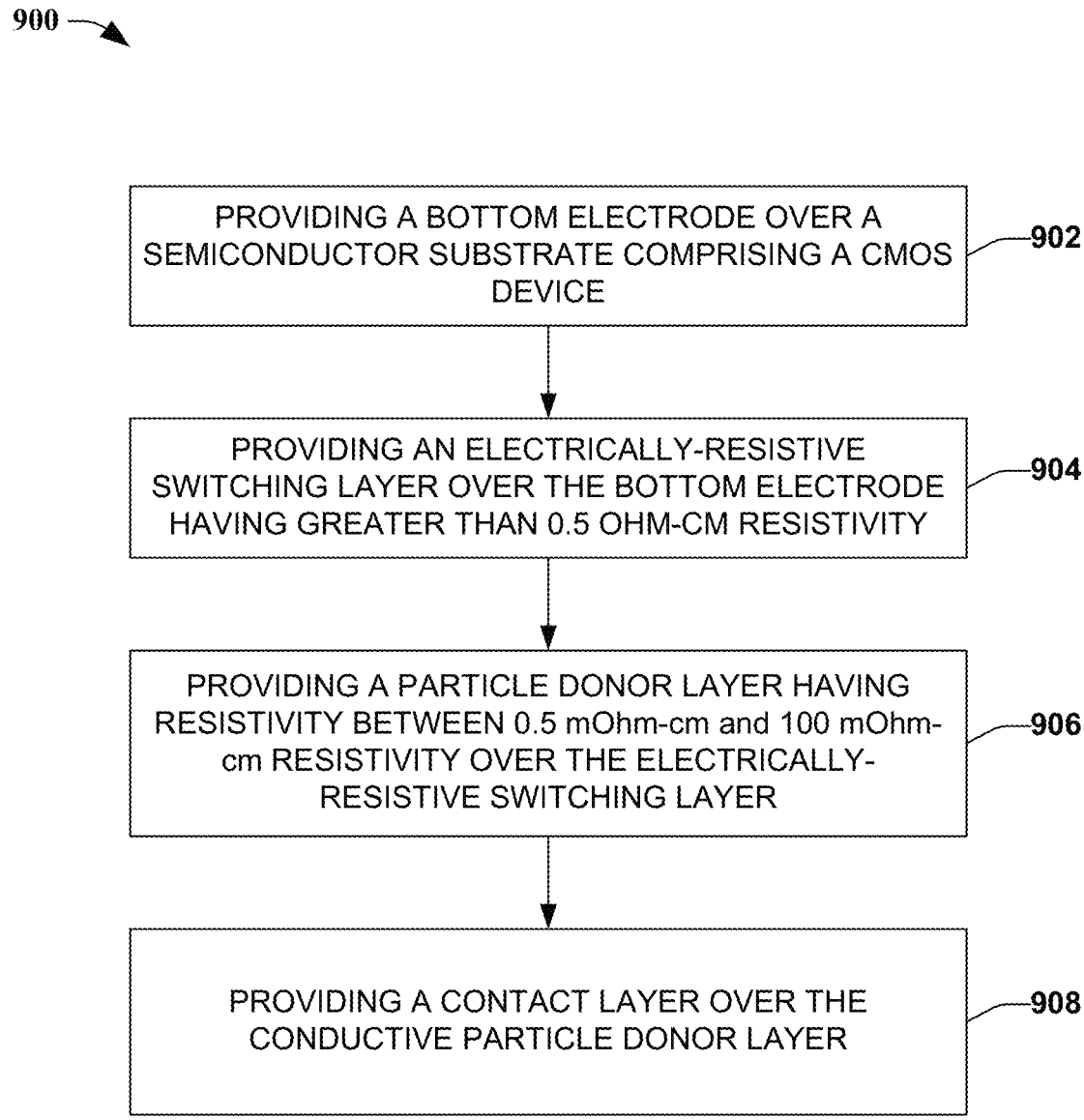
FIG. 9 illustrates a flowchart of an example method for fabricating a two-terminal memory having intrinsic current compliance, in an embodiment.
Figure 10:
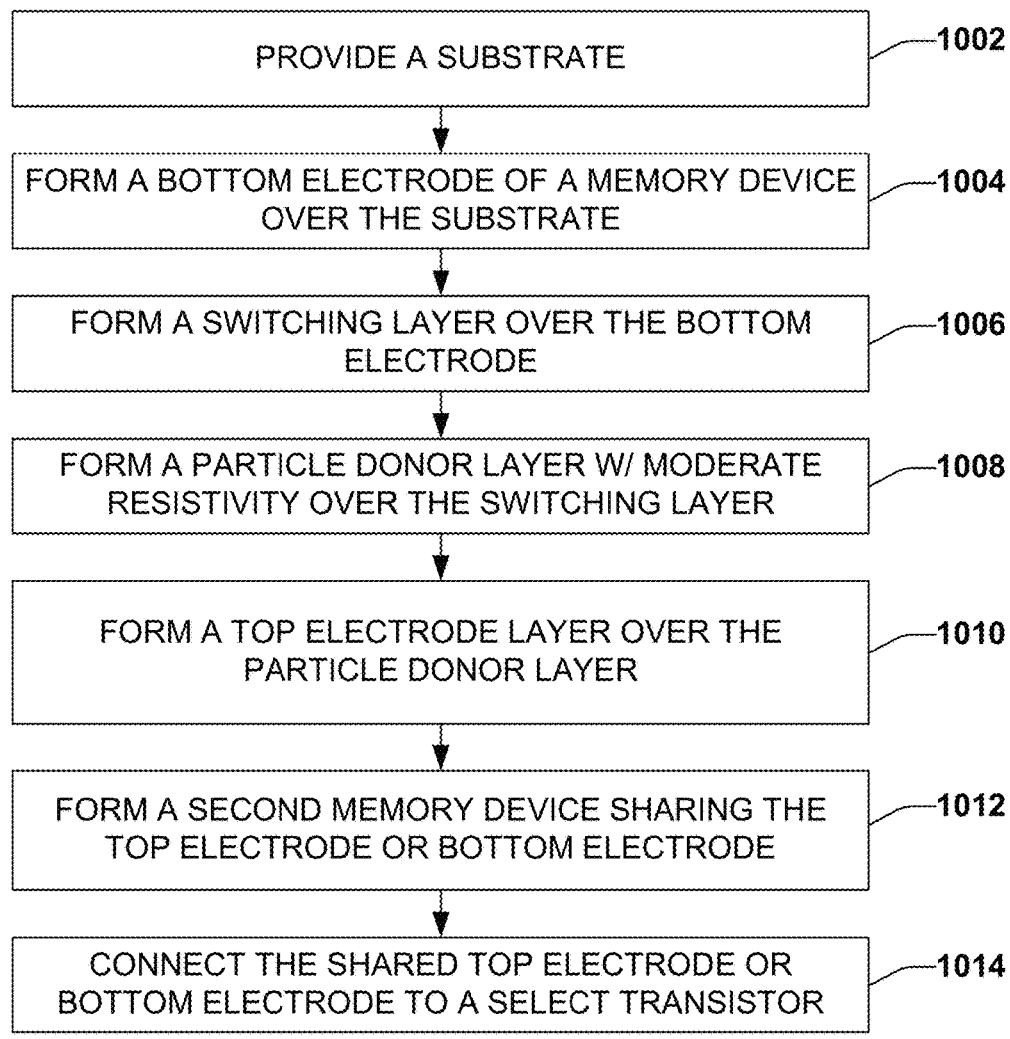
FIG. 10 depicts a flowchart of a sample method for fabricating a two-terminal memory with intrinsic current compliance in another embodiment.
Figure 11:
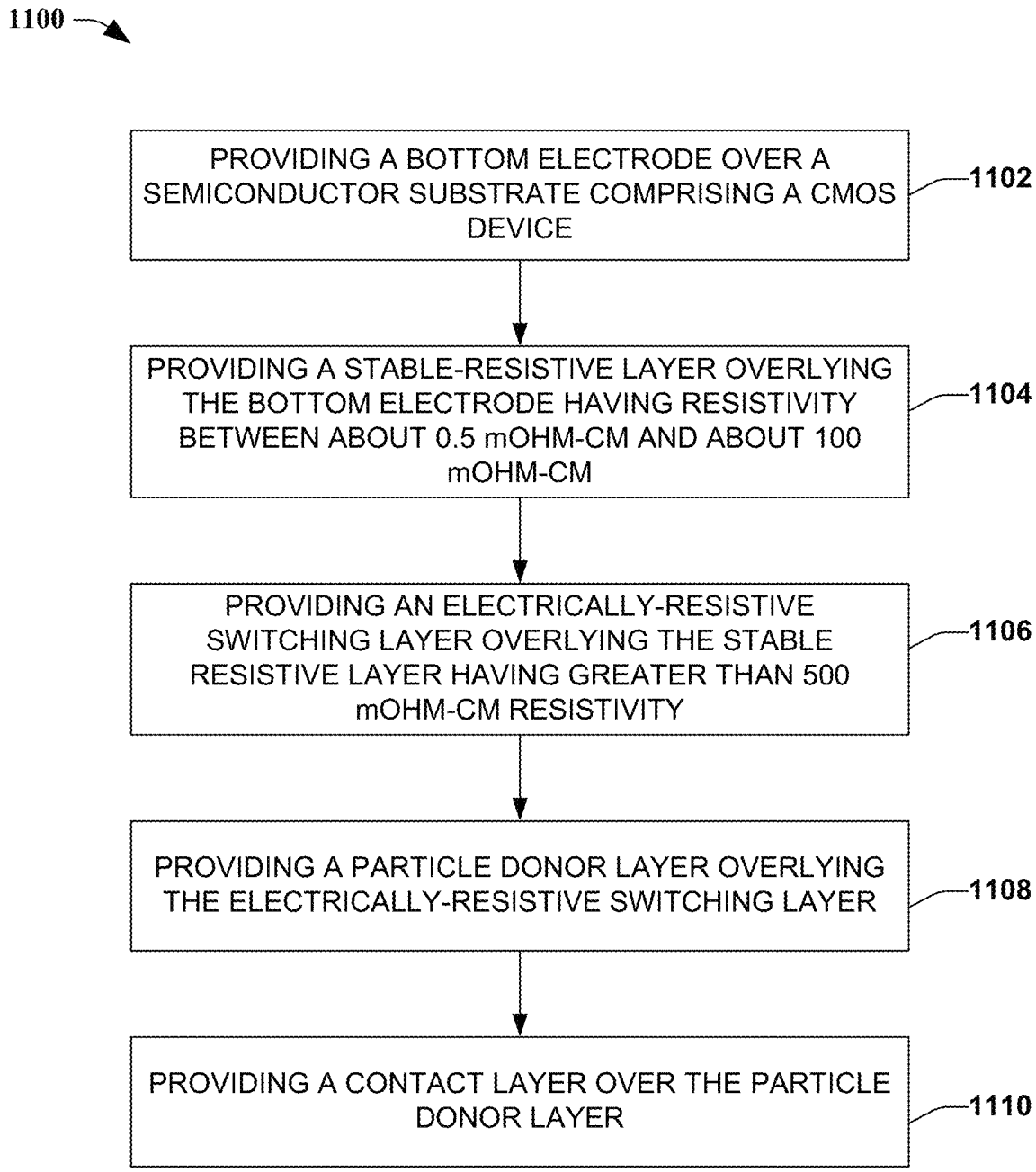
FIG. 11 illustrates a flowchart of an example method for fabricating a two-terminal memory having intrinsic current compliance in further embodiments.

In view of the exemplary diagrams described supra, process methods that can be implemented in accordance with the disclosed subject matter will be better appreciated with reference to the flow charts of FIGS. 9-11. While for purposes of simplicity of explanation, the methods of FIGS. 9-11 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 9 depicts a flowchart of an example method 900 for fabricating a memory cell according to alternative or additional embodiments of the present disclosure. At 902, method 900 can comprise providing a bottom electrode over a semiconductor substrate comprising a CMOS device. In various embodiments, the bottom electrode can be a conductive material, such as TiN, TaN, W, WN, TiW, or a suitable alloy of the foregoing. In other embodiments, the bottom electrode can be a conductive silicon (e.g., a polycrystalline SiGe, a doped polycrystalline SiGe, a polysilicon, a doped polysilicon, etc.).

At 904, method 900 can comprise providing an electrically-resistive switching layer over the bottom electrode. In some embodiments, the switching layer can have greater than 0.5 ohm-cm material resistivity. Further, the switching layer can be at least in part porous to conductive particles (e.g., metal ions, oxygen vacancies, etc.). The switching layer can further comprise defect sites therein (e.g., silicon dangling bonds, vacancies, voids, etc.) in which the conductive particles can become trapped in the absence of a suitably strong external stimulus. In some embodiments, the switching layer can be comprised of a Si-bearing material, a solid electrolyte, a metal oxide, a metal nitride, or the like. In one or more embodiments, the switching layer can comprise a material selected from the group consisting of: $SiO_y$, $AlN_y$, $TiO_y$, $TaO_y$, $AlO_y$, $CuO_y$, $SiN_x$, $TiN_x$, $TiN_y$, $TaN_x$, $TaN_y$, $SiO_x$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x.

At 906, method 900 can comprise providing a particle donor layer having a second material resistivity, over the electrically-resistive switching layer. The second material resistivity can be in a range between about 0.5 mohm-cm and about 100 mohm-cm. In various embodiments, the particle donor layer can be selected to have a second material resistivity in proportion to a first material resistivity of the switching layer. In some embodiments, the proportion can be about 1:5; in other embodiments the proportion can be about 1:1000; whereas in still other embodiments the proportion can be selected from a range between about 1:5 and about 1:1000. In further embodiments, the proportion of second material resistivity of the particle donor layer to the first material resistivity of the switching layer can be larger than 1:1000 (e.g., 1:5000, 1:10,000, 1:100,000, etc.). In further embodiments, the particle donor layer can comprise a metal nitride selected from the group consisting of: $TiN_x$, $TaN_x$, $AlN_x$, $CuN_x$, $WN_x$ and $AgN_x$, where x is a positive number. In other embodiments, the particle donor layer can comprise a metal oxide selected from the group consisting of: $TiO_x$, $TaO_x$, $AlO_x$, $CuO_x$, WO, and $AgO_x$ In yet other embodiments, the particle donor layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. In at least one embodiment, the switching layer can be provided with a metal nitride $MN_y$, and the particle donor layer can be provided with a metal nitride $MN_x$, where y is larger than x. In a further embodiment, the switching layer can be provided with a metal oxide $MO_y$, and the particle donor layer can be provided with a metal oxide $MO_x$. In yet another embodiment, the particle donor layer can be provided with a metal compound selected from a first group consisting of MN and $MO_x$, and the switching layer can be provided with a silicon compound selected from a second group consisting of: $SiN_y$, and $SiO_y$, where y is a non-stoichiometric value.

At 908, method 900 can comprise providing a contact layer over the conductive particle donor layer. The contact layer can be a top electrode, in some embodiments. For instance, the contact layer can comprise a metal wire of a memory array, a conductive plug that electrically connects the particle donor layer to the metal wire of the memory array, or the like. The contact layer can be formed of a suitable electrical conductor, such as a metal (e.g., Al, Cu, Ag, and so forth in conjunction with optional barrier material or adhesion material, including Ti, TiN, TaN, TiW, or the like, below or above the conductor layer), a conductive silicon (e.g., doped polysilicon, doped polycrystalline SiGe, etc.), or the like.

FIG. 10 depicts a flowchart of a sample method 1000 for fabricating a memory cell according to further embodiments. At 1002, method 1000 can comprise providing a substrate for an electronic device. At 1004, method 1000 can comprise forming a bottom electrode of a memory device over the substrate. At 1006, method 1000 can comprise forming a switching layer over the bottom electrode, and at 1008, method 1000 can comprise forming a particle donor layer with moderate resistivity over the switching layer. In various embodiments, the particle donor layer can have a resistivity between about 0.5 mohm-cm and about 100 mohm-cm. In a further embodiment, the particle donor layer can have an electrical resistance between about 1 kilo-ohms and about 100 kilo-ohms. At 1010, method 1000 can comprise forming a top electrode layer over the particle donor layer. At 1012, method 1000 can comprise forming a second memory device sharing the top electrode or bottom electrode, and forming one or more additional memory devices, up to a suitable number n (where n can be, e.g., 128, 256, 512, 1024, 2048, etc.) of memory devices sharing the top electrode or the bottom electrode. At 1014, method 1000 can comprise connecting the shared top electrode or bottom electrode to a select transistor.

FIG. 11 illustrates a flowchart of a sample method 1100 for fabricating a memory device according to alternative or additional embodiments of the present disclosure. At 1102, method 1100 can comprise providing a bottom electrode over a semiconductor substrate comprising a CMOS device. The bottom electrode can comprise any suitable conductive material described herein or known in the art. At 1104, method 1100 can comprise providing a stable resistive layer overlying the bottom electrode. The stable resistive layer can be fabricated so as to have a resistivity between about 0.5 mohm-cm and about 100 mohm-cm, in some embodiments. In some embodiments, the stable resistive layer can be composed of $SiN_x$, $TaN_y$ or $WN_z$ where x, y and z are positive numbers selected to produce compounds having resistivity between about 0.5 mohm-cm and about 100 mohm-cm. At 1106, method 1100 can comprise providing an electrically-resistive switching layer overlying the stable resistive layer. The electrically-resistive switching layer can have much larger resistivity. As one example, the electrically-resistive switching layer can have a resistivity greater than about 500 mohm-cm. The electrically-resistive switching layer can be a silicon bearing material, in some embodiments, a solid electrolyte, a metal oxide, a metal nitride, or other suitable material described herein or known in the art. At 1108, method 1100 can comprise providing a particle donor layer overlying the electrically-resistive switching layer. The particle donor layer can be a metal, such as Ag, Al, Cu, Pt, Pd, and others, or can be comprised of such a metal. At 1110, method 1100 can comprise forming a contact layer over the particle donor layer. The contact layer can be a metal wire of a memory array (e.g., a bitline, a wordline, a sourceline, a dataline, etc.), or can be a metal plug providing electrical continuity between the particle donor layer and such a metal wire, as one example.

Example Operating Environments

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing.

Figure 12:
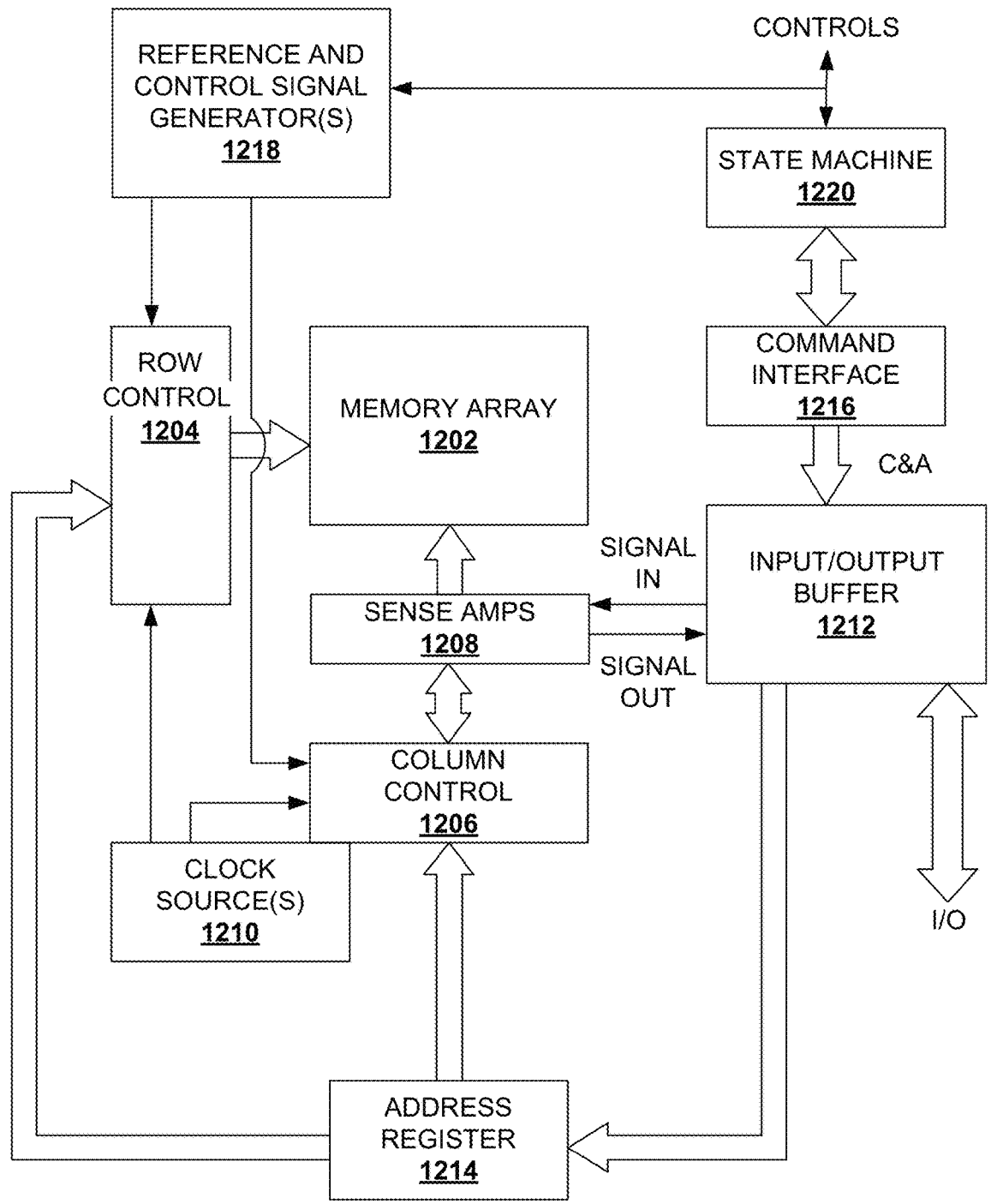
FIG. 12 illustrates a block diagram of an example electronic operating environment in accordance with certain embodiments of this disclosure.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of electronic memory or architectures and process methods for fabricating such memory or architectures, those skilled in the art will recognize that the subject disclosure also can be implemented in combination with other architectures or process methods. Moreover, those skilled in the art will appreciate that the disclosed processes can be practiced with a processing system or a computer processor, either alone or in conjunction with a host computer (e.g., computer 1302 of FIG. 13, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 12 illustrates a block diagram of an example operating and control environment 1200 for a memory bank 1202 of a multi-bank memory cell array according to aspects of the subject disclosure. In at least one aspect of the subject disclosure, memory bank 1202 can comprise memory selected from a variety of memory cell technologies. In at least one embodiment, memory bank 1202 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 1206 and sense amps 1208 can be formed adjacent to memory bank 1202. Moreover, column controller 1206 can be configured to activate (or identify for activation) a subset of bitlines of memory bank 1202. Column controller 1206 can utilize a control signal provided by a reference and control signal generator(s) 1218 to activate, as well as operate upon, respective ones of the subset of bitlines, applying suitable program, erase or read voltages to those bitlines. Non-activated bitlines can be kept at an inhibit voltage (also applied by reference and control signal generator(s) 1218), to mitigate or avoid bit-disturb effects on these non-activated bitlines.

In addition, operating and control environment 1200 can comprise a row controller 1204. Row controller 1204 can be formed adjacent to and electrically connected with word lines of memory bank 1202. Further, utilizing control signals of reference and control signal generator(s) 1218, row controller 1204 can select particular rows of memory cells with a suitable selection voltage. Moreover, row controller 1204 can facilitate program, erase or read operations by applying suitable voltages at selected word lines.

Sense amps 1208 can read data from, or write data to the activated memory cells of memory bank 1202, which are selected by column control 1206 and row control 1204. Data read out from memory bank 1202 can be provided to an input and input/output buffer 1212 (e.g., an LPDDR buffer, in some embodiments). Likewise, data to be written to memory bank 1202 can be received from the input and input/output buffer 1212 and written to the activated memory cells of memory bank 1202.

A clock source(s) 1210 can provide respective clock pulses to facilitate timing for read, write, and program operations of row controller 1204 and column controller 1206. Clock source(s) 1210 can further facilitate selection of wordlines or bitlines in response to external or internal commands received by operating and control environment 1200. Input and input/output buffer 1212 can comprise a command and address input, as well as a bidirectional data input and output. Instructions are provided over the command and address input, and the data to be written to memory bank 1202 as well as data read from memory bank 1202 is conveyed on the bidirectional data input and output, facilitating connection to an external host apparatus, such as a computer or other processing device (not depicted, but see e.g., computer 1302 of FIG. 13, infra).

Input and input/output buffer 1212 can be configured to receive write data, receive an erase instruction, receive a status or maintenance instruction, output readout data, output status information, and receive address data and command data, as well as address data for respective instructions. Address data can be transferred to row controller 1204 and column controller 1206 by an address register 1210. In addition, input data is transmitted to memory bank 1202 via signal input lines between sense amps 1208 and input and input/output buffer 1212, and output data is received from memory bank 1202 via signal output lines from sense amps 1208 to input and input/output buffer 1212. Input data can be received from the host apparatus, and output data can be delivered to the host apparatus via the I/O bus.

Commands received from the host apparatus can be provided to a command interface 1216. Command interface 1216 can be configured to receive external control signals from the host apparatus, and determine whether data input to the input and input/output buffer 1212 is write data, a command, or an address. Input commands can be transferred to a state machine 1220.

State machine 1220 can be configured to manage programming and reprogramming of memory bank 1202 (as well as other memory banks of the multi-bank memory array). Instructions provided to state machine 1220 are implemented according to control logic configurations, enabling state machine 1220 to manage read, write, erase, data input, data output, and other functionality associated with memory bank 1202. In some aspects, state machine 1220 can send and receive acknowledgments and negative acknowledgments regarding successful receipt or execution of various commands. In further embodiments, state machine 1220 can decode and implement status-related commands, decode and implement configuration commands, and so on.

To implement read, write, erase, input, output, etc., functionality, state machine 1220 can control clock source(s) 1208 or reference and control signal generator(s) 1218. Control of clock source(s) 1208 can cause output pulses configured to facilitate row controller 1204 and column controller 1206 implementing the particular functionality. Output pulses can be transferred to selected bitlines by column controller 1206, for instance, or wordlines by row controller 1204, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In connection with FIG. 13, the systems and processes described below can be embodied within hardware, such as a single integrated circuit (IC) chip, multiple ICs, an application specific integrated circuit (ASIC), separate devices interconnected by one or more input/output interfaces or communication devices, or the like. Further, the order in which some or all of the process blocks appear in each process should not be deemed limiting. Rather, it should be understood that some of the process blocks can be executed in a variety of orders, not all of which may be explicitly illustrated herein.

Figure 13:
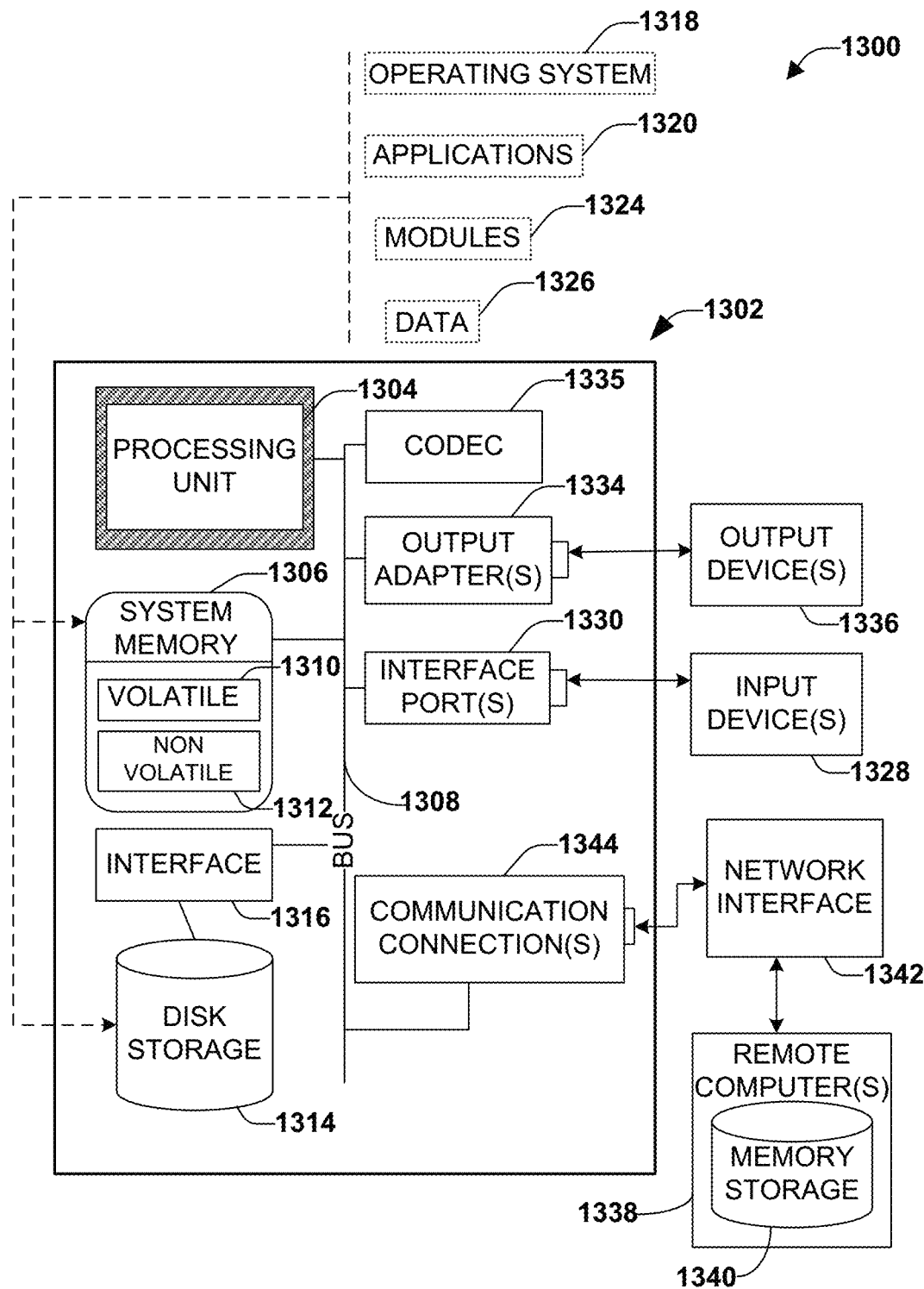
FIG. 13 illustrates a block diagram of an example computing environment in accordance with certain embodiments of this disclosure.

With reference to FIG. 13, a suitable environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1312. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or flash memory. Volatile memory 1310 includes random access memory (RAM), which acts as external cache memory. According to present aspects, the volatile memory may store the write operation retry logic (not shown in FIG. 13) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), among others.

Computer 1302 may also include removable/non-removable, volatile/non-volatile computer storage medium. FIG. 13 illustrates, for example, disk storage 1314. Disk storage 1314 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1314 to the system bus 1308, a removable or non-removable interface is typically used, such as interface 1316. It is appreciated that storage devices 1314 can store information related to a user. Such information might be stored at or provided to a server or to an application running on a user device. In one embodiment, the user can be notified (e.g., by way of output device(s) 1336) of the types of information that are stored to disk storage 1314 and/or transmitted to the server or application. The user can be provided the opportunity to opt-in or opt-out of having such information collected and/or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer system 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices 1336 like monitors, speakers, and printers, among other output devices 1336, which require special adapters. The output adapters 1334 include, by way of illustration and not limitation, video and sound cards that provide a means of connection between the output device 1336 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1344 refers to the hardware/software employed to connect the network interface 1342 to the bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors or memory cells), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for a semiconductor device, comprising:
providing with a plurality of complementary metal oxide semiconductor (CMOS) devices disposed in a semiconductor substrate, a programming voltage across a top electrode of a resistive memory device and a bottom electrode of the resistive memory device, wherein the resistive memory also includes a resistive switching material layer disposed upon the bottom electrode, and a metal donor layer disposed between the resistive switching material layer and the top electrode;
generating active metal particles from the metal donor layer in response to the providing the programming voltage;
disposing the active metal particles from the metal donor layer to the resistive switching material layer in response to the generating the active metal particles and in response to the providing the programming voltage;
forming a conductive filament from the active metal particles within the resistive switching material layer thereby decreasing a resistance of the resistive switching material layer in response to the disposing the active metal particles to the resistive switching material layer and in response to the providing the programming voltage;
forming a localized metal particle depletion region in the metal donor layer adjacent to the conductive filament; and
increasing a resistance of the metal donor layer at least in part in response to the disposing the active metal particles to the resistive switching material layer and forming the localized metal particle depletion region in the metal donor layer.

2. The method of claim 1 wherein the active metal particles are selected from a group consisting of: Ti, Ta, Al, Cu and Ag.

3. The method of claim 1
wherein the metal donor layer comprises a non-stoichiometric metal nitride, MNx; and
wherein the resistive switching material comprises a non-stoichiometric metal nitride, MNy; and
wherein y is larger than x.

4. The method of claim 1 wherein at least one of:
the resistive switching material layer comprises a non-stoichiometric metal oxide: MOy; or
the metal donor layer comprises a non-stoichiometric metal nitride, MNx.

5. The method of claim 1
wherein the metal donor layer comprises a non-stoichiometric metal nitride; and
wherein the resistive switching material layer comprises a non-stoichiometric metal oxide.

6. The method of claim 1
wherein the resistive memory is characterized by a first rate of gain of current flow with respect to the programming voltage prior to the forming of the conductive filament within the resistive switching material layer; and
wherein the resistive memory is characterized by a second rate of gain of current flow with respect to the programming voltage after the forming of the conductive filament within the resistive switching material layer,
wherein the first rate of gain exceeds the second rate of gain.

7. The method of claim 1 wherein increasing the resistance of the metal donor layer is further in response to an effective surface area over which the conductive filament is in electrical contact with the particle donor layer at a boundary between the particle donor layer and the electrically-resistive switching layer.

8. The method of claim 1 wherein the metal donor layer is comprised of a non-stoichiometric material selected from a group consisting of: TiNx, TaNx, AlNx, CuNx, AgNx, TiOx, TaOx, AlOx, CuOx, AgOx, TiOaNb, AlOaNb, CuOaNb, WOaNb and AgOaNb where x, a, and b are respective non-stoichiometric positive numbers.

9. The method of claim 8, wherein the resistive switching material layer includes a non-stoichiometric material selected from a second group consisting of: a silicon bearing material, a solid electrolyte, TiNy, TaNy, SiOy, AlNy, CuNy, AgNy, TiOy, TaOy, AlOy, CuOy, and AgOy where x is different from y.

10. A method for an electronic device having a non-volatile memory cell, comprising:
applying a program signal across a first electrode and a second electrode of the non-volatile memory cell;
providing from a particle donor layer adjacent to the second electrode to an electrically-resistive switching layer disposed between the particle donor layer and the first electrode, current-carrying particles in response to the program signal;
beginning formation of a conductive filament in the electrically-resistive switching layer in response to the current-carrying particles from the particle donor layer and to the program signal;
wherein the particle donor layer maintains a first resistance during the beginning formation of the conductive filament;
completing formation of the conductive filament in the electrically-resistive switching layer in response to the current-carrying particles from the particle donor layer and to the program signal; and at least one of:
forming a localized current-carrying particle depletion region in the particle donor layer and increasing a resistance of the particle donor layer from the first resistance to a second resistance in response at least to the forming the localized current-carrying particle depletion region, wherein the second resistance exceeds the first resistance; or
limiting an effective surface area over which the conductive filament is in electrical contact with the particle donor layer at a boundary between the particle donor layer and the electrically-resistive switching layer, and limiting a conduction path within the particle donor layer to less than a width of the particle donor layer, thereby limiting an increase in current through the non-volatile memory cell in response to completing the formation of the conductive filament in the absence of current limitation circuitry external to the non-volatile memory cell.

11. The method of claim 10, wherein: applying the program signal further comprises applying a voltage in a range from about 1 volt (v) to about 3.3 v across the first electrode and the second electrode; and further comprising applying a reverse bias signal across the first electrode and the second electrode in a second range from about −1 v to about −2.5 v causing an electrical discontinuity of the conductive filament in the electrically-resistive switching layer.

12. A method of fabricating a non-volatile memory cell, comprising:
providing a semiconductor substrate having a plurality of complementary metal oxide semiconductor (CMOS) devices disposed therein;
forming a bottom electrode of the non-volatile memory cell overlying the semiconductor substrate;
forming an electrically-resistive switching layer above the bottom electrode that is at least in part permeable to movement of current-carrying particles;
forming a particle donor layer overlying the electrically-resistive switching layer that provides the current-carrying particles to the electrically-resistive switching layer in response to a first stimulus applied to the non-volatile memory cell; and
forming a top electrode overlying the particle donor layer, wherein the particle donor layer has an electrical resistivity of about 0.5 milliohm (mohm)-centimeter (cm) or greater, and further wherein at least one of:
the particle donor layer forms a localized depletion region of conductive particles having higher electrical resistance than a surrounding region of the particle donor layer in response to the first stimulus;
an effective surface area over which a conductive filament formed by the current-carrying particles within the electrically-resistive switching layer is in electrical contact with a portion of the particle donor layer is limited in dimension, and the limited dimension portion of the particle donor layer also limits a conduction path within the particle donor layer to less than a width of the particle donor layer, thereby limiting an increase in current through the non-volatile memory cell in response to completing the formation of the conductive filament; or
both the particle donor layer forms the localized depletion region in response to the first stimulus and the effective surface area over which the conductive filament is in electrical contact with the portion of the particle donor layer is limited in dimension in response to the first stimulus.

13. The method of claim 12, further comprising forming the electrically-resistive switching layer from a material having a resistivity of about 500 mohm-cm or greater.

14. The method of claim 13, further comprising selecting the material from a group consisting of: a Si-bearing material, a metal oxide and a metal nitride.

15. The method of claim 12, further comprising:
forming the electrically-resistive switching material from a material selected from a first group consisting of: a silicon bearing material, $SiO_y$, $AlN_y$, $TiO_y$, $TaO_y$, $AlO_y$, $CuO_y$, $TiN_x$, $TiN_y$, $TaN_x$, $TaN_y$, $SiO_x$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$;
forming the particle donor layer from a second material selected from a second group consisting of: $TiN_x$, $TaN_x$, $AlN_x$, $CuN_x$, $AgN_x$, $TiO_x$, $TaO_x$, $AlO_x$, $CuO_x$, $AgO_x$, $TiO_aN_b$, $AlO_aN_b$, $CuO_aN_b$, $WO_aN_b$ and $AgO_aN_b$ where x, y, a, and b are suitable positive numbers; and
where y>x.

16. The method of claim 12, further comprising:
forming the electrically-resistive switching material from a material selected from a first group consisting of: a first metal nitride: $MN_y$; and
forming the particle donor layer of a second material selected from a second group consisting of: a second metal nitride: $MN_x$; where y>x.

17. The method of claim 12, further comprising:
forming the electrically-resistive switching material from a material selected from a first group consisting of: a first metal oxide $MO_y$; and
forming the particle donor layer of a second material selected from a second group consisting of: a second metal oxide $MO_x$; where y>x.

18. The method of claim 12, further comprising:
forming the electrically-resistive switching material from a material selected from a first group consisting of: a silicon nitride $SiN_y$ and a silicon oxide $SiO_y$; and
forming the particle donor layer of a second material selected from a second group consisting of: a metal nitride $MN_x$ and a metal oxide $MO_x$; where y is a non-stoichiometric value.

19. The method of claim 12, further comprising:
forming the electrically-resistive switching material to have a first thickness in a range of 2 nanometers (nm) to 100 nm; and
forming the particle donor layer to have a second thickness in a range of 5 nm to 200 nm.

20. The method of claim 12, further comprising forming particle donor layer to have the electrical resistivity in a proportion to a second electrical resistivity of the electrically-resistive switching layer, wherein the proportion is selected from a group consisting of: about 1:5, about 1:1000, a range between about 1:5 and about 1:1000, 1:5000, 1:10,000 and 1:100,000.

* * * * *